US011437600B2

(12) United States Patent
Kobayashi et al.

(10) Patent No.: US 11,437,600 B2
(45) Date of Patent: Sep. 6, 2022

(54) SUBSTRATE SEALING STRUCTURE BODY, AND, DISPLAY DEVICE AND PRODUCTION METHOD THEREFOR

(71) Applicant: SHARP KABUSHIKI KAISHA, Sakai (JP)

(72) Inventors: Yuhki Kobayashi, Sakai (JP); Shinichi Kawato, Sakai (JP); Kiyoshi Minoura, Sakai (JP); Shinji Shimada, Sakai (JP); Hiroshi Tsuchiya, Sakai (JP); Masahiro Mitani, Sakai (JP); Kohzoh Nakamura, Sakai (JP); Katsuhiko Kishimoto, Sakai (JP); Yozo Narutaki, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 17/529,214

(22) Filed: Nov. 17, 2021

(65) Prior Publication Data
US 2022/0077421 A1 Mar. 10, 2022

Related U.S. Application Data

(62) Division of application No. 16/648,172, filed as application No. PCT/JP2017/034935 on Sep. 27, 2017, now Pat. No. 11,211,579.

(51) Int. Cl.
*H01L 51/52* (2006.01)
*G09F 9/00* (2006.01)
(Continued)

(52) U.S. Cl.
CPC ........ *H01L 51/5246* (2013.01); *G02F 1/1339* (2013.01); *G02F 1/1368* (2013.01); *H01L 51/5218* (2013.01); *H01L 51/56* (2013.01)

(58) Field of Classification Search
CPC . H01L 51/5218; H01L 51/5246; H01L 27/32; G02F 1/1339; H05B 33/04;
(Continued)

(56) References Cited

U.S. PATENT DOCUMENTS 6,567,147 B1 5/2003 Hirakata
7,023,518 B1 4/2006 Koyama et al.
(Continued)

FOREIGN PATENT DOCUMENTS

EP 2182565 A1 5/2010
JP 2008-210770 A 9/2008
(Continued)

*Primary Examiner* — Caridad Everhart
(74) *Attorney, Agent, or Firm* — ScienBiziP, P.C.

(57) ABSTRACT

In the present embodiment, a sealing agent (50) sealing two substates contains a low melting-point glass material and is adhered to each of a first substrate (10) and a second substrate (20), a barrier rib (60), which is formed in such a manner as to surround the outer periphery of an electronic element (30), is disposed between the sealing agent (50) and the electronic element (30), and between the first substrate (10) and the second substrate (20), and the sealing agent (50) is spaced apart from the barrier rib (60). As a result, a deterioration of the electronic element, caused by the heat produced when sealing, may be prevented while the electronic element formed between the two substrates is protected from moisture and oxygen.

6 Claims, 6 Drawing Sheets

(51) Int. Cl.
    *G02F 1/1339*     (2006.01)
    *G02F 1/1368*     (2006.01)
    *H01L 51/56*     (2006.01)

(58) Field of Classification Search
    CPC ........ H05B 33/02; H05B 33/10; H05B 33/12; H05B 33/22
    See application file for complete search history.

(56) References Cited

U.S. PATENT DOCUMENTS

| | | | |
|---|---|---|---|
| 7,180,566 | B2 | 2/2007 | Lee |
| 9,040,972 | B2 | 5/2015 | Moon et al. |
| 2008/0203904 | A1 | 8/2008 | Kim et al. |
| 2009/0009063 | A1 | 1/2009 | Botelho et al. |
| 2010/0096984 | A1 | 4/2010 | Kim |
| 2010/0221501 | A1* | 9/2010 | Chen ............... B29C 63/0026 156/60 |
| 2010/0244057 | A1 | 9/2010 | Ryu et al. |
| 2011/0012873 | A1 | 1/2011 | Prest et al. |
| 2012/0080671 | A1 | 4/2012 | Niboshi et al. |
| 2012/0235557 | A1* | 9/2012 | Lee .................. H01L 51/5246 313/495 |
| 2012/0248950 | A1* | 10/2012 | Niibori ............ H01L 51/5246 312/223.1 |
| 2012/0287026 | A1 | 11/2012 | Masuda |
| 2012/0299816 | A1 | 11/2012 | Lee |
| 2013/0065476 | A1 | 3/2013 | Kim |
| 2013/0134396 | A1 | 5/2013 | Shimomura et al. |
| 2013/0271714 | A1 | 10/2013 | Hirota |
| 2014/0063432 | A1 | 3/2014 | Yamazaki et al. |
| 2014/0216645 | A1 | 8/2014 | Nakamura |
| 2015/0189717 | A1 | 7/2015 | Kuranaga et al. |
| 2016/0026018 | A1 | 1/2016 | Zhang |
| 2016/0343978 | A1 | 11/2016 | Qian et al. |
| 2017/0092177 | A1 | 3/2017 | Kobayashi et al. |
| 2017/0155082 | A1 | 6/2017 | Mu |
| 2017/0227800 | A1 | 8/2017 | Yamazaki et al. |
| 2018/0053903 | A1 | 2/2018 | Suzuki et al. |
| 2018/0198096 | A1 | 7/2018 | Yasuda et al. |

FOREIGN PATENT DOCUMENTS

| | | |
|---|---|---|
| JP | 2008-218393 A | 9/2008 |
| JP | 2008-225381 A | 9/2008 |
| JP | 2010-103112 A | 5/2010 |
| JP | 2010-108905 A | 5/2010 |
| JP | 2010-225569 A | 10/2010 |
| JP | 2013-125718 A | 6/2013 |
| JP | 2013-137997 A | 7/2013 |
| JP | 2013-218234 A | 10/2013 |
| JP | 2014-063153 A | 4/2014 |
| JP | 2014-167912 A | 9/2014 |
| JP | 2017-062474 A | 3/2017 |
| JP | 2017-120667 A | 7/2017 |
| JP | 2017-120867 A | 7/2017 |
| WO | 2010/143337 A1 | 12/2010 |
| WO | 2011/004567 A1 | 1/2011 |
| WO | 2012/011268 A1 | 1/2012 |
| WO | 2017/002372 A1 | 1/2017 |

\* cited by examiner

SUBSTRATE SEALING STRUCTURE BODY, AND, DISPLAY DEVICE AND PRODUCTION METHOD THEREFOR

TECHNICAL FIELD

The present invention relates to a substrate sealing structure, a hybrid type display apparatus combining a reflecting type liquid crystal display element and an organic EL display element, and a manufacturing method therefor.

BACKGROUND ART

With respect to an electronic element having a need to be isolated from outer air, such as an organic EL light emitting element in which an organic compound being easy to degrade due to moisture or an electrode being easy to decrease in performance due to oxidation, it is required that performance degradation of the element is inhibited by preventing penetration of moisture and oxygen. Therefore, Patent document 1, for example, discloses using a glass frit to paste together, by laser light, two substrates sandwiching a light emitting element therebetween. However, as shown in FIG. 5A of the present application, Patent document 1 discloses that an inner filling agent 86 is filled between a light emitting element 80 and a light transmitting layer 85, the light emitting element 80 and the inner filling agent 86 are surrounded by a sealant portion 87 such that the inner filling agent 86 does not flow out. And a sealant agent 88 comprising the glass frit is formed on the outer periphery of the sealant portion 87 in contact with the sealant portion 87, and an element substrate 89a and a sealing substrate 89b are bonded. The light emitting element 80 comprises a first electrode 81, an organic layer 82, a second electrode 83, and a protective layer 84 coating the surrounding of the first electrode 81, the organic layer 82, and the second electrode 83. For both the inner filling agent 86 and the sealant portion 87, a resin such as an acrylic-based resin or an epoxy-based resin to be cured by UV or cured with heat is used.

Moreover, as shown in FIG. 5B of the present application, Patent document 2 discloses that a second sealing line 94 is formed, in a double sealing structure, at the exterior of a first sealing line 93 to seal a first substrate 91 and a second substrate 92. Patent document 2 discloses that the second sealing line 94, for which an inorganic material is used, can be cured by laser light. However, as shown in FIG. 5B, by making the size of the first substrate 91 different from that of the second substrate 92, the second sealing line 94 is formed such that it comes into contact with a top surface of the first substrate 91, the lateral surface of the second substrate 92, and the first sealing line 93. In FIG. 5B, an electronic element being sealed in by both substrates 91 and 92 are omitted.

PRIOR ART DOCUMENT

Patent Documents

Patent Document 1: JP 2010-103112 A
Patent Document 2: JP 2008-210770 A

SUMMARY OF THE INVENTION

Problem to be Solved by the Invention

As described previously, while the related art sealing between the first substrate and the second substrate is formed as a double sealing, the sealing agent 88 and the sealant portion 87 shown in FIG. 5A or the first sealing line 93 and the second sealing line 94 shown in FIG. 5B are in contact with each other. In this way, when two sealing agents are in contact, in a case that a glass frit is used for the sealing agent 88 or the second sealing line 94, the temperature increases to from 350 degree Celsius to 600 degree Celsius or more at the time of adhering the glass frit by heating it using laser light. Therefore, it is envisaged that a portion of the light emitting element 80 in contact or in the vicinity of the sealant portion 87 or the first sealing line 93 increases in temperature, to cause the element characteristics to be degraded.

Moreover, it is believed that, when the sealant portion 87 or the first sealing line 93 increases in temperature, the temperature of the sealant portion 87 or the first sealing line 93 being subjected to thermosetting or UV ray curing gets higher than the temperature at the time of curing using thermosetting or UV ray curing, to cause gas to be generated. The gas generated at this time stays in the surrounding of the light emitting element 80 as it is, possibly leading to a detrimental influence on the light emitting element 80.

Aimed at solving the problems, an object of the present invention is to provide a sealing structure that can prevent degradation, due to heat at the time of sealing, of an electronic element formed between two substrates while having a substrate sealing structure that can protect the electronic element from moisture and oxygen.

Another object of the present invention is to provide a display apparatus and a manufacturing method therefor, the display apparatus having a sealing structure that can protect, even for a hybrid type display apparatus comprising both a liquid crystal display element and an organic EL display element, the organic EL display element from penetration of moisture and oxygen while also suppressing degradation of either one of the elements due to heat.

Means to Solve the Problem

A sealing structure according to Embodiment 1 comprises a substrate sealing structure comprising: a first substrate and a second substrate, the first substrate and the second substrate being arranged in an opposing manner; an electronic element being formed between the first substrate and the second substrate; and a sealing agent to seal the first substrate and the second substrate at the outer periphery of the electronic element, wherein the sealing agent comprises a low melting point glass material and is adhered onto each of the first substrate and the second substrate; wherein a barrier rib being formed to surround the outer periphery of the electronic element is arranged between the sealing agent and the electronic element and between the first substrate and the second substrate; and wherein the sealing agent and the barrier rib are in separation.

A display apparatus according to Embodiment 2 comprises a TFT substrate comprising a drive element being formed for each pixel of a display screen and a first insulating layer planarizing a surface above the drive element; a reflecting electrode for a liquid crystal display element, the reflecting electrode being formed in a first region of one pixel of the TFT substrate above the first insulating layer; an organic EL display element comprising a first electrode, an organic layer, a second electrode, and an encapsulating layer, the organic EL display element being formed in a second region of the one pixel, the second region being adjacent to the first region on the first insulating layer of the TFT substrate; an opposing substrate comprising an opposing electrode opposing the reflecting electrode, the opposing substrate being arranged in a manner opposing the TFT substrate; a liquid crystal layer being filled between the TFT substrate and the opposing substrate; and a sealing agent adhering together the TFT substrate and the opposing substrate, wherein the sealing agent comprises a low melting point glass material and is adhered onto each of the TFT substrate and the opposing substrate; wherein a barrier rib is arranged between the sealing agent and the liquid crystal layer and between the TFT substrate and the opposing substrate; and wherein the sealing agent and the barrier rib are in separation.

A display apparatus manufacturing method according to Embodiment 3 comprises: forming a TFT substrate on which at least a drive element is formed; forming a reflecting electrode and an organic EL display element above or on a surface of the TFT substrate, the reflecting electrode being for a liquid crystal display element; forming an opposing substrate comprising an opposing electrode for the liquid crystal display element; arranging a barrier rib material at a peripheral edge portion of an element forming region for the reflecting electrode for the liquid crystal display element and the organic EL display element in either one of the TFT substrate and the opposing substrate; arranging a sealing agent material in separation with the barrier rib material at a portion opposite to the element forming region of the barrier rib material in either one of the TFT substrate and the opposing substrate; dropping a liquid crystal composition onto the element forming region surrounded by the barrier rib material; superimposing the TFT substrate and the opposing substrate; and adhering the TFT substrate and the opposing substrate using the sealing agent material, wherein a material comprising a low melting point glass is used for the sealing agent material, and the sealing agent material is adhered onto the TFT substrate and the opposing substrate by irradiation of laser light.

Effects of the Invention

According to the present Embodiments, a barrier rib is formed in separation with the sealing agent and between the electronic element and the sealing agent while completely sealing between two substrates using a sealing agent comprising a low melting point glass, without a way of thinking of a double sealing. Therefore, even in a case that the sealing agent is adhered onto the substrate by laser light, heat generated at the time of adhering is shielded by the barrier rib, so that the electronic element is protected. Moreover, as the sealing agent and the barrier rib are in separation, the temperature of the barrier rib itself does not increase as much, so that gas is hardly generated from the barrier rib.

EMBODIMENT FOR CARRYING OUT THE INVENTION

Embodiment 1: Substrate Sealing Structure

Figure 1:
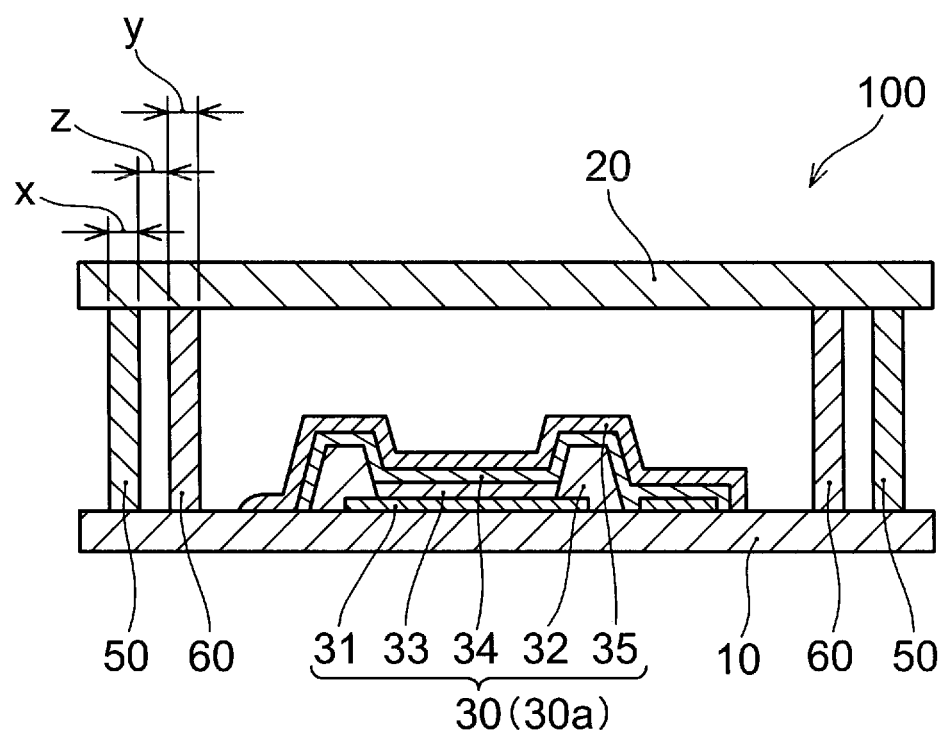
FIG. 1 shows a cross-sectional view of a sealing structure according to Embodiment 1.

Next, a substrate sealing structure according to Embodiment 1 of the present invention is described with reference to the drawing. As shown in FIG. 1, a sealing structure 100 according to Embodiment 1 comprises: a first substrate 10 and a second substrate 20, the first substrate 10 and the second substrate 20 being arranged in an opposing manner; an electronic element 30 being formed between the first substrate 10 and the second substrate 20; and a sealing agent 50 to seal the first substrate 10 and the second substrate 20 at the outer periphery of the electronic element 30. According to the present Embodiment, the sealing agent 50 comprises a low melting point glass material and is adhered onto each of the first substrate 10 and the second substrate 20; a barrier rib 60 being formed to surround the outer periphery of the electronic element 30 is arranged between the sealing agent 50 and the electronic element 30 and between the first substrate 10 and the second substrate 20; and the sealing agent 50 and the barrier rib 60 are in separation. The substrate sealing structure means a collective name for an electronic device in which the surrounding of the electronic element 30 being arranged between two substrates is sealed with the structure according to the present Embodiment.

Moreover, the electronic element 30 in "the barrier rib 60 being formed so as to surround the outer periphery of the electronic element 30" means a group of electronic elements making up an electronic device, so that, in a case that the electronic device is a lighting apparatus, it means one or a plurality of organic EL light emitting elements (below called merely an OLED) making up the lighting apparatus, and, in a case that the electronic device is a display apparatus, it means a group of electronic elements such as a plurality of OLEDs making up each pixel. In a case of a large-sized substrate in which a plurality of electronic devices are manufactured at one time, the barrier rib 60 and the sealing agent 50 are formed in the surrounding of the electronic element 30 for each one electronic device.

The first substrate 10 and the second substrate 20 are not particularly limited as long as they have air tightness. They can be an insulating substrate, a semiconductor substrate, or a conductive substrate. Even when the insulating substrate is preferable in a case that the electronic element 30 (comprising an electrode being a component thereof) is formed on the surface of one of the substrates, an insulating layer can be formed on the surface of the semiconductor substrate or the conductive substrate to use the semiconductor substrate or the conductive substrate. Moreover, the first substrate 10 and the second substrate 20 can be a substrate having rigidity, or a flexible substrate. Furthermore, the first substrate 10 and the second substrate 20 can be a combination of different types of materials, e.g., a combination of the semiconductor substrate and the insulating substrate. In a case of the display apparatus or a light emitting apparatus (the lighting apparatus), a glass substrate, or a resin film such as polyimide can be used. While the first substrate 10 and the second substrate 20 are shown in a simple one-sheet structure in FIG. 1, an element such as a drive element (not shown) can be formed.

While the electronic element 30 is not particularly limited, the substrate sealing structure 100 according to the present Embodiment is particularly effective for the electronic element 30 being an OLED for which a material easily degraded due to moisture and oxygen is used. Moreover, the substrate sealing structure 100 is also effective for an electronic element with a need to seal in a liquid crystal or a liquid, such as a liquid crystal element or a dye-sensitive solar cell. Moreover, the substrate sealing structure 100 can comprise two or more electronic elements 30 such as in a case of a hybrid type display apparatus comprising the below-described liquid crystal display element (below merely called an LCD) and the OLED.

In the example shown in FIG. 1, an OLED 30a is formed as the electronic element 30 on the first substrate 10 being made of glass. In other words, an insulating bank 32 is formed to surround the surrounding of a first electrode 31, an organic layer 33 and a second electrode 34 are formed above the first electrode 31, and an encapsulating layer (TFE; thin film encapsulation) 35 is formed above the organic layer 33 and the second electrode 34. While the OLED 30a is shown with a structure of only main portions for simplicity in the example shown in FIG. 1, it can have the same structure as that of the OLED 30a to be described in below-described Embodiment 2, details of which will be described below.

The sealing agent 50 is designed so that, with the first substrate 10 and the second substrate 20 being made as an air-tight sealing, the electronic element 30 arranged therein does not degrade due to moisture and oxygen. Therefore, a glass material, not resins capable of easily transmitting moisture, such as an epoxy resin, is used. As long as the width (thickness) x of the sealing agent 50 is approximately 0.05 mm or more and 2.0 mm or less, there is no problem with air-tight sealing. On the other hand, the electronic element 30 is sealed in between the first substrate 10 and the second substrate 20, so that the temperature cannot be increased so much in a case of adhering the sealing agent 50 onto the first and second substrates 10, 20 by glass. Therefore, a low melting point glass having a low softening point (a temperature at which the glass turns into the so-called rubber state) is used.

While the low melting point glass is a glass composition into which a low melting point oxide is mixed to decrease the softening point temperature and generally has the softening point temperature of from 350 degree Celsius to 600 degree Celsius or higher, a glass having the softening point as low as possible is preferable for bonding a substrate on which the electronic element 30 is formed in the present Embodiment. From such a viewpoint, a vanadium-based low melting point glass can be used, for example. The vanadium-based low melting point glass comprising $V_2O_5$—$P_2O_5$—$TeO_2$—$Fe_2O_3$ as principal components has the softening point of approximately 370 degree Celsius. In other words, the vanadium-based low melting point glass is heated to approximately from 370 degree Celsius to 400 degree Celsius to be softened, brought into close contact with the substrate and, then, cooled to turn it into solid phase, causing it to be adhered onto the substrate. This vanadium-based low melting point glass having high light absorbability in the visible to infrared region allows local heating and bonding by laser light. However, even with the low melting point glass, the heat-resistant temperature of the electronic element 30 is generally much lower. Thus, heat generated at the time of adhering the sealing agent 50 onto the substrate needs to be shielded to not cause various elements formed on the substrate to be influenced by heat.

Figure 5A:
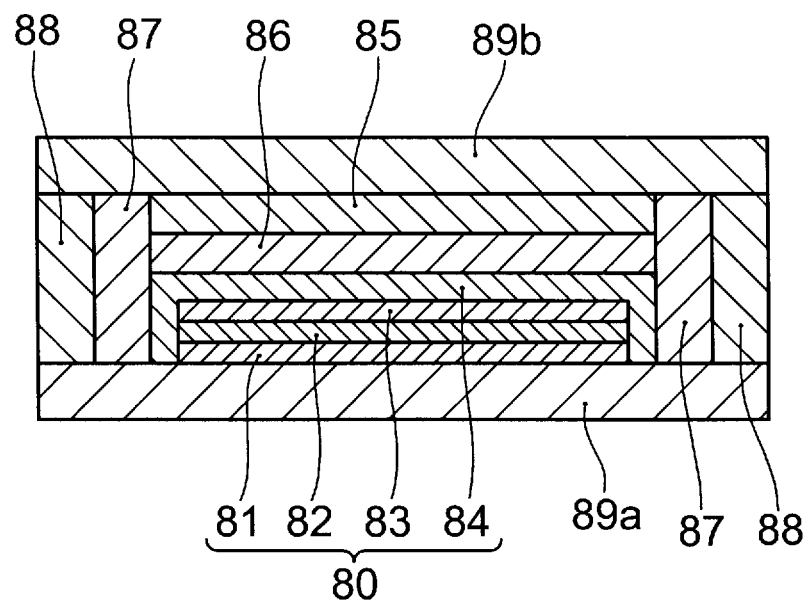
FIG. 5A shows a cross-sectional view of one example of a related-art sealing structure.
Figure 5B:
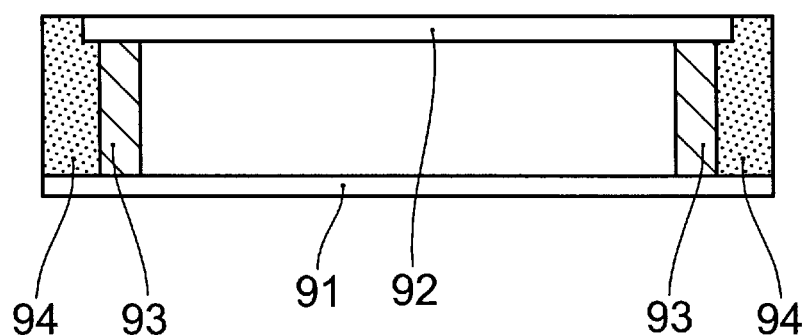
FIG. 5B shows a cross-sectional view of another example of the related-art sealing structure.

In other words, even with above-mentioned low melting point, the glass material increases to approximately 400 degree Celsius in temperature, as shown in previously-described FIGS. 5A and 5B, in a case that the sealant portion 87 and the sealing agent 88 or the sealing line 93 and the second sealing line 94 are being in contact, heat at the time of adhering the sealing agent 88 or the second sealing line 94 can easily be transferred to the sealant portion 87 or the first sealing line 93. Then, a portion of the light emitting element 80 being in contact with or in proximity to the sealant portion 87 or the first sealing line 93 can be a factor to degrade the performance with the temperature thereof easily increasing. Moreover, in a case that a resin is used for this sealant portion 87, gas is generated also from the resin itself, so there is a risk of the gas being sealed in between the substrates. Thus, according to the present Embodiment, as described below, the electronic element 30 and the sealing agent 50 are being in separation so that heat is not conducted to a portion of the electronic element 30 at the time of adhering this low melting point glass (sealing agent 50).

Figure 3A:
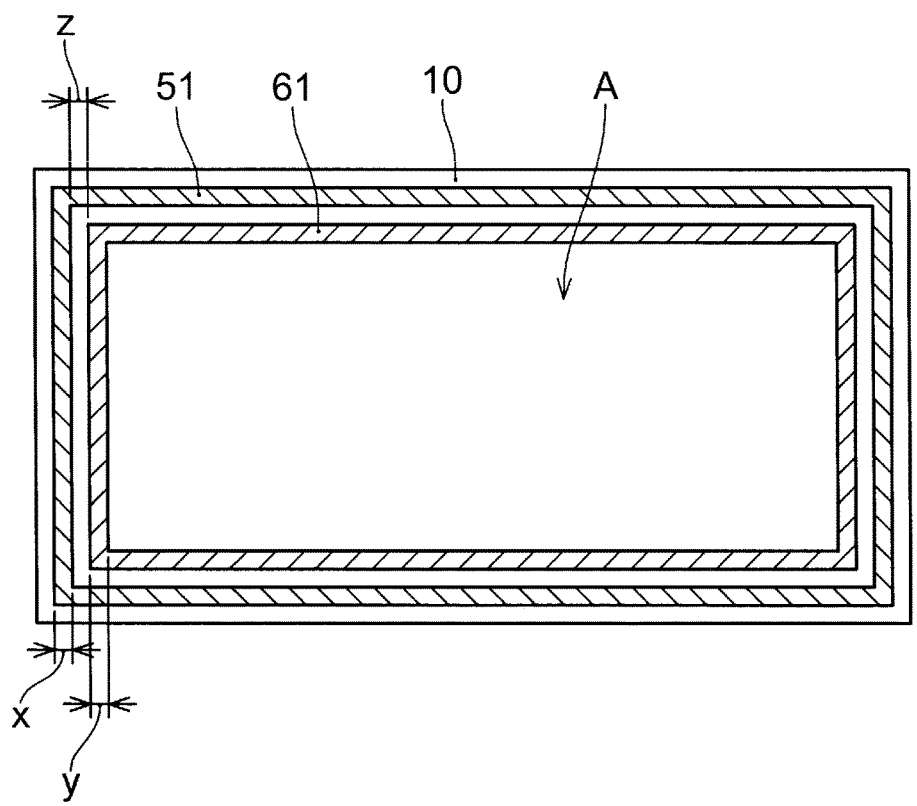
FIG. 3A shows a plan view in a state in which a barrier rib material and a sealing agent material are formed by printing on a surface of one of substrates in the manufacturing process.

This low melting point glass is turned into paste form, as a glass frit being made into fine powders, for example, using a binder comprising an organic solvent. As shown in FIG. 3A, for example, the sealing agent material 51 is applied onto a given portion of the substrate 10 and then cured to cause the sealing agent 50 to be formed. In FIG. 3A in which a barrier rib material 61 (an inorganic material paste) to be described below is also shown, the sealing agent material 51 can be formed by screen printing or dispensing at the outer periphery of the barrier rib material 61 in separation therewith. This sealing agent material 51 is applied onto a given portion of either one of the first substrate 10 and the second substrate 20. The given portion is a portion having a given spacing z with the barrier rib material 61 at a further outer periphery of the barrier rib material 61, the barrier rib material 61 being formed at the peripheral edge of an element forming region A (see FIG. 3A) of the electronic element 30. Then, after the other substrate is aligned with and superimposed, laser light is irradiated to cause the sealing agent material 51 to be adhered onto each substrate with an increase in temperature of no less than the softening point. The substrate at which the sealing agent material 51 or the barrier rib material 61 is formed is not limited to the substrate at which the electronic element 30 is formed. The sealing agent material 51 and the barrier rib material 61 can also be formed in the surrounding of a region in which the element forming region A of the electronic element 30 is shadowed (projected) on the other substrate. Moreover, the sealing agent material 51 and the barrier rib material 61 can be formed at different substrates.

As the laser light for use in this adhering, various laser light sources can be used since the low melting point glass being the above-described material has high light absorbability in the visible light to infrared region. Therefore, a $CO_2$ laser (wavelength of 10.6 μm) being generally used, for example, can be used. A $CO_2$ laser light of almost the same wavelength as the spacing (cell gap of approximately from 5 μm to 10 μm) of the substrates to seal in the OLED or LCD can be used to soften the entire sealing agent 50, allowing the entire fine powders to be turned into a softened state, resulting in a solidified matter with no gap between the fine powders.

The sealing agent material 51 is not limited to a material of a low melting point glass being turned into paste form and applied. It can be a glass ribbon 51b (see FIG. 3B), for example. With the glass ribbon 51b being attached onto one of the first substrate 10 and the second substrate 20, the first substrate 10 and the second substrate 20 can be superimposed, and, thereafter, bonded by irradiation of laser light. In this case, the glass ribbon 51b can be formed from molten glass by directly pouring it into a mold, or it can also be formed by molding and solidifying a paste of the previously-described glass frit. In a case of forming a ribbon from this paste, a solvent is evaporated at the time of forming the ribbon, making it possible to soften a glass ribbon in a porous state to create a ribbon with air gaps being eliminated, or, as described above, to sandwich, between the two substrates, the porous ribbon having air gaps, and, thereafter, turn it into the softened state, causing it to be adhered onto the substrates at the same time as the disappearance of the air gaps. From a viewpoint of not sealing in gas within the sealing agent 50, the glass ribbon 51b having no air gaps is preferable.

In a case of bonding the glass ribbon 51b having no air gaps (being non-porous) to a substrate, it is not necessary to turn the entire glass ribbon 51b into the softened state, but is necessary to soften only a portion bonding to the substrate. However, there is no problem even in a case of solidifying after the entire glass ribbon 51b is turned into the softened state. This is because there is no generation of gas even when being turned into the softened state since there are no air gaps in the first place. Therefore, the glass ribbon 51b can be adhered onto the substrate with no generation of gas in a manner similar to the case of turning the glass frit into the softened state.

In a case of forming the sealing agent 50 using the glass ribbon 51b, with the glass ribbon 51b being attached onto a given portion (a location to be sealed) of either one of the two substrates, for example, the first substrate 10, and the second substrate 20 being superimposed, the sealing agent 50 and each of the substrates can thereafter be adhered by irradiation of laser light as described previously. In this case, as shown in FIGS. 3B and 3C, it suffices that an adhesive be adhered onto only a portion of the glass ribbon 51b (on an adhering portion B), not on the entire surface of the glass ribbon 51b.

Figure 3B:
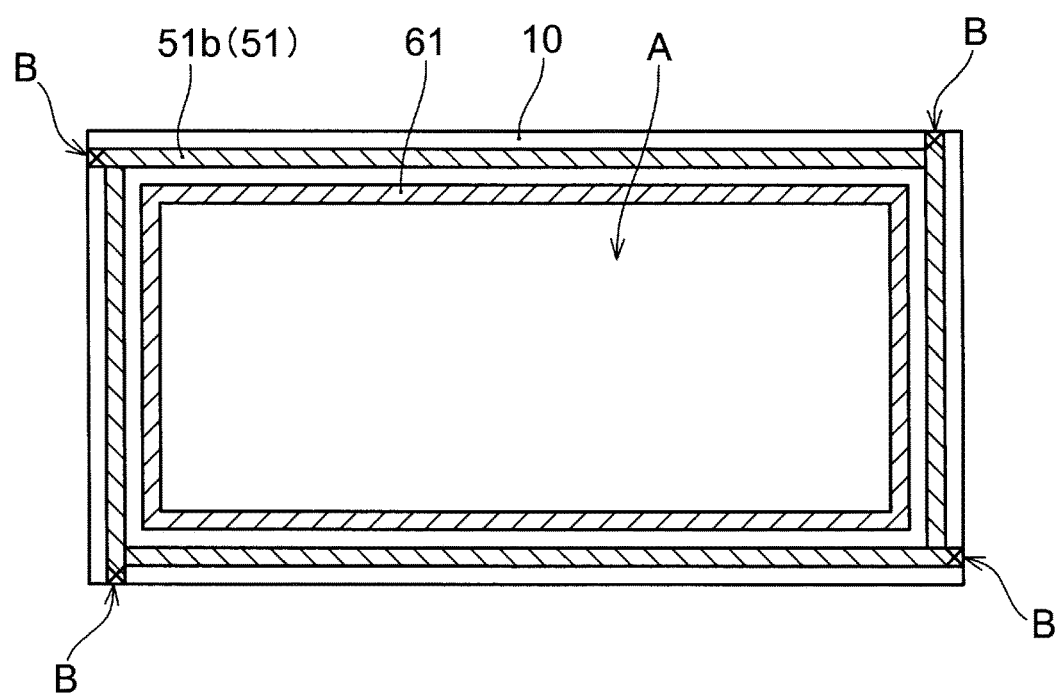
FIG. 3B shows a plan view explaining a method of fixing glass ribbons as a sealing material in the manufacturing process.
Figure 3C:
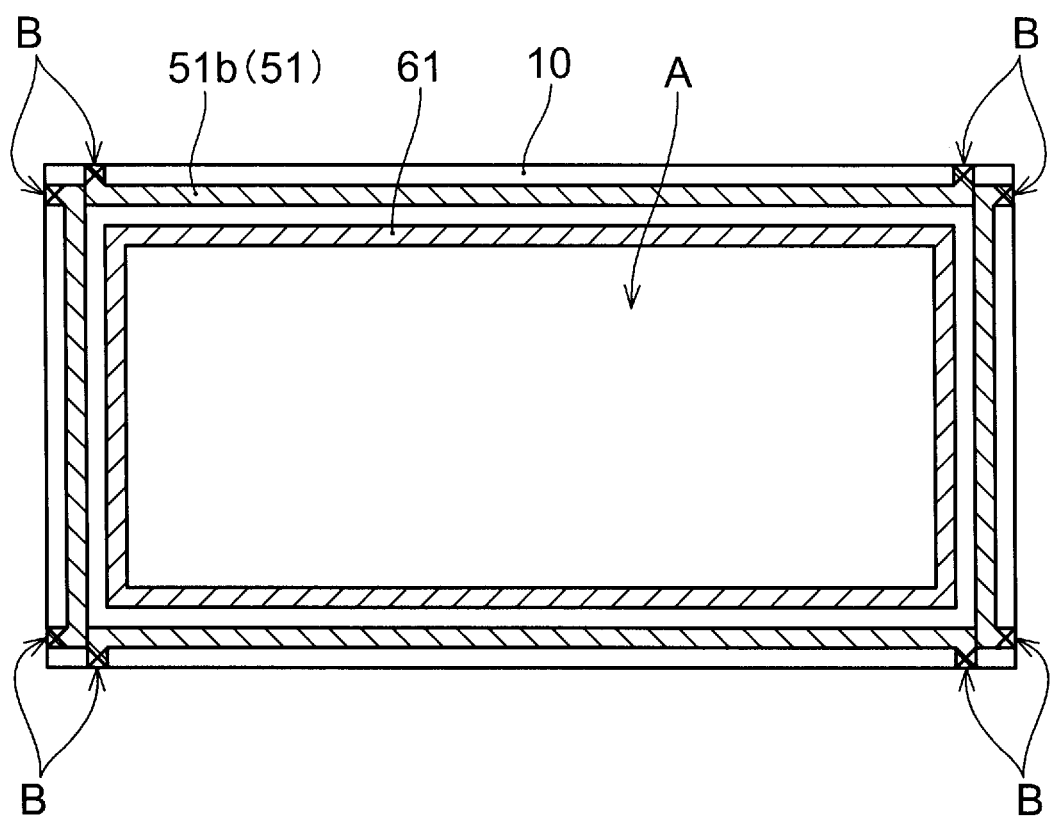
FIG. 3C shows a plan view showing a different example of fixing glass ribbons as the sealing material agent in the manufacturing process.

Specifically, as shown in FIGS. 3B to 3C, a sealing portion is divided into a plurality of divided portions (for example, each side of a rectangular substrate) to create a plurality of glass ribbons 51b, each having a length for each divided portion of the sealing portion, which glass ribbon 51b can be fixed by adhering an adhesive (not shown) onto only the adhering portion B of one end portion (an example of FIG. 3B) or both end portions (an example of FIG. 3C) of the glass ribbon 51b. In this case, each glass ribbon 51b is formed longer by a length of the adhering portion B. In this way, as shown in FIGS. 3B to 3C, the adhering portion B to adhere the adhesive can be provided at the exterior of the sealing portion. In other words, the adhering portion B can be arranged at the exterior of a portion to be adhered by laser light after the first substrate 10 and the second substrate 20 are superimposed. This is because, as the time to adhering by irradiation of laser light after arranging the glass ribbon 51b is not so long, the risk of the glass ribbon 51b being displaced before adhering is very small. Moreover, while adhering between the substrate 10 and the glass ribbon 51b is stable in a case that the adhesive is attached onto the entire surface of the glass ribbon 51b, the risk of sealing in, between the substrates, gas generated from the adhesive at the time of adhering onto the substrate 10 by laser light can be avoided.

The example shown in FIG. 3B being an example in which an adhesive is attached only onto the one end portion of the glass ribbon 51b, the attached portion B onto which the adhesive is attached is provided onto a portion opposite to the electronic element 30 of the sealing agent 50. The other end portion of the glass ribbon 51b being butted against the other glass ribbon 51b is bonded to and integrated with the other glass ribbon at the time it is adhered thereonto. As a result, even when the temperature of the glass ribbon 51b increases at the time of adhering onto the substrate, gas generated from the adhesive due to the temperature increase thereof is to be discharged to the exterior of the sealing agent 50.

In the example shown in FIG. 3C, dividing of the glass ribbon 51b is dividing into four along each side of the rectangular substrate 10 in the same manner as the example in FIG. 3B. The divided respective glass ribbons 51b are made slightly longer, so that they are formed into a shape in which the both end portions are folded 90 degree. The glass ribbons 51b are formed such that the folded portions are located at the exterior of a portion to be the sealing agent 50 as shown in FIG. 5C. As a result, in a manner similar to the example in FIG. 3B, the attaching portion B to be attached with the adhesive is to be at the exterior of the sealing agent 50, so that it will not be sealed in toward the electronic element 30 even when gas is generated from the adhesive. Even more, attaching can be provided at both end portions of the glass ribbon 51b, making it possible to adhere the glass ribbon 51b very stably.

The barrier rib 60 being provided between the sealing agent 50 and the electronic element 30 is provided in separation with the sealing agent 50. Therefore, the barrier rib 60 is also formed to surround the electronic element 30. In other words, even with a liquid-like material such as a liquid crystal in the electronic element 30, the barrier rib 60 is provided to isolate the liquid-like material such that the liquid-like material does not come into direct contact with the sealing agent 50 and suppress conductance of heat at the time of heating for adhering the sealing agent 50. Therefore, heat caused by heating at the time of adhering the sealing agent 50 onto the first substrate 10 and the second substrate 20 being transferred to the electronic element 30 allows suppressing degradation of the electronic element 30.

In other words, the barrier rib 60 serves to shield heat. For example, it is known that, in a case the electronic element 30 comprises a liquid crystal material (a liquid crystal composition), the liquid crystal material degrades when the temperature increases to no less than 150 degree Celsius. Even more, the liquid crystal material is not fixed at a given location as in solid, but can flow. Therefore, the barrier rib 60 serves to suppress heat conductance from the sealing agent 50 as well as to avoid the liquid crystal material being in contact with the sealing agent 50 heated. Therefore, it is preferable that the barrier rib 60 be arranged at a location being as far away as possible from the sealing agent 50.

The thickness y of the barrier rib 60 of 0.1 mm or more and 1.0 mm or less can suppress heat conductance. The larger the thickness the more preferred since, even when the temperature of the surface of the barrier rib 60 opposing the sealing agent 50 increases due to radiant heat from the sealing agent 50, the heat is difficult to be transferred to the electronic element 30. However, when the thickness of the barrier rib 60 is increased too much, the dimension of the structure 100 increases, which is against the demands for lighter, thinner, and shorter electronic equipment units. Therefore, it is preferable to set the above-described dimension y that allows suppressing heat conductance and satisfying the mechanical strength between the first substrate 10 and the second substrate 20.

Moreover, it is preferable that the spacing z between the sealing agent 50 and the barrier rib 60 be no less than 0.5 mm. While larger this spacing z the more preferred from the viewpoint of suppressing heat conductance, in a case that the spacing z is increased, the size of the electronic equipment unit increases as described above, which is against the trend for lighter, thinner, and shorter electronic equipment units. On the other hand, it is confirmed that heat conductance in a space of heat from a heat source being heated to approximately 400 degree Celsius during a heating time of approximately a few seconds can be almost prevented by providing a spacing of 0.5 mm. Therefore, it suffices that the spacing z be 1 mm at the most.

The barrier rib 60 is aimed at providing a partition so that a portion of the electronic element 30 does not come into contact with the sealing agent 50 in this way as well as suppressing conductance to the electronic element 30 of heat generated at the time of adhering the sealing agent 50. Therefore, barrier rib 60 is not aimed at sealing, so that it is not necessary to adhere the barrier rib 60 onto the substrate. Thus, there is no need to adhere barrier rib 60 onto the substrate using resins such as the sealant portion 87 or the first sealing line 93 as shown in FIGS. 5A and 5B as previously described. Rather than using such thermosetting resins, it is preferable to use an inorganic material such as glass or ceramics. In other words, using resins such as a thermosetting resin to cure the resins to provide a related-art sealing structure causes moisture generated at the time of curing to be sealed in between the substrates, causing the electronic element 30 to be always exposed to moisture and oxygen generated at the time of thermosetting even when penetration of external moisture is prevented by sealing the outer periphery of the substrates using glass. Therefore, the thermosetting resin can easily be a cause to degrade the electronic element 30.

As an inorganic material that can be used as the barrier rib 60, glass, ceramics, metal oxides, metals, and semiconductors can be used, for example. As the glass, a glass frit or a glass ribbon of a low-melting point glass used as the previously-described sealing agent 50, for example, can also be used. The glass frit being turned into paste form using a binder, which paste form is applied onto one substrate by printing, and, thereafter, only the organic material component being vaporized before superimposing the other substrate make it possible to obtain a solidified matter whose generation of gas after the evaporating organic solvent is almost not problematic as, even when the binder remains in modest amount, the amount is very small. Moreover, in a case of the glass ribbon, it is pasted onto one substrate 10 with an adhesive, so that it can comprise an organic material of the adhesive, but the amount of the adhesive is very small and the temperature is not increased, so that generation of gas is almost not problematic. Furthermore, a photosensitive glass paste can also be applied and cured.

Even other inorganic materials such as ceramics or metal oxides can also be provided as the barrier rib 60 by mixing fine powders with the organic solvent or the binder in the same manner as the glass frit. In these cases, as described above, in a case of primarily an inorganic material while a non-inorganic material such as the organic solvent or the binder can also be comprised, or in other words, not less than 90% in volume is the inorganic material, there is almost no generation of gas, so that it can be used as the inorganic material.

Moreover, the barrier rib material 61 can be formed also by combining masking with techniques such as vapor deposition or sputtering. According to the above-mentioned method, the barrier rib 60 can be formed using only the inorganic material without using at all the organic solvent, and various materials can be used.

As long as the barrier rib 60 is adhered onto one of the first substrate 10 and the second substrate 20, the barrier rib 60 does not have to be adhered onto the other substrate thereof. In other words, this is because the barrier rib 60 does not need to have a sealing function as described previously. Therefore, even with the barrier rib material 61 being fine powders and eventually a porous body, for example, it suffices that the fine holes thereof be very small and the flow of a liquid-like material being a portion of the electronic element 30, such as a liquid crystal, be preventable. Therefore, while the hole diameter of the porous body can vary in accordance with the type of electronic element 30, in a case that the electronic element 30 comprises a liquid crystal material, the liquid crystal material does not flow out as long as the hole diameter is no more than 5 μm and, preferably, no more than 1 μm. The above discussion is predicated on the porous body, so that, as a matter of course, the hole diameter is greater than zero. It is not particularly problematic even when the liquid crystal material flows out a little and comes into contact with the sealing agent 50.

On the other hand, the barrier rib 60 being a porous body is rather preferable since heat conductance to the electronic element 30 is suppressed even when the temperature of the surface opposing the sealing agent 50 of the barrier rib 60 increases due to radiation of heat generated at the time of adhering the sealing agent 50. Therefore, the barrier rib 60 of the inorganic material having fine holes can be obtained by, using a binder, turning fine powders into paste form, which paste form is heated and cured after printing to evaporate organic matter. Moreover, even when the binder does not completely disappear and remains as an adhesive, in a case that the amount thereof is an amount being not more than 10% of the total volume, it is believed that there is no generation of gas such that the element characteristics of the electronic element 30 is degraded. This method can solidify not only glass powders, but also similarly solidify fine powders of other inorganic matters such as ceramics or metal oxides.

For a structure in which the barrier rib 60 is adhered onto only one of the first substrate 10 and the second substrate 20, while not adhering onto the other thereof, even in a case of using a thermosetting resin as the barrier rib material 61, as long as it is subjected to thermosetting before superimposing the first substrate 10 and the second substrate 20, gas (moisture and oxygen) being generated at the time of curing the thermosetting resin can be discharged externally without being sealed in between the first and second substrate 10 and 20. Therefore, the barrier rib 60 is not limited to the inorganic material. In this case, preferably, the spacing z between the sealing agent 50 and the barrier rib 60 is increased sufficiently to approximately 0.7 mm or more and 1 mm or less, for example, such that the barrier rib 60 is not heated by heat generated at the time of adhering the sealing agent 50.

While the barrier rib 60 does not need to be sealed in an air-tight manner between the first substrate 10 and the second substrate 20 as described previously, the barrier rib 60 being adhered to both the first substrate 10 and the second substrate 20 is preferable in that the spacing between the first substrate 10 and the second substrate 20 can be accurately maintained and also the mechanical strength of the structure 100 can be improved. For adhering with the first substrate 10 and the second substrate 20, the barrier rib material 61 is attached onto one of the substrates in the previously-described method, or the barrier rib material 61 is applied and thereafter cured. Thereafter, the adhesive is applied onto the upper surface of the barrier rib material 61 and, then, the first substrate 10 and the second substrate 20 are superimposed. Thereafter, at the time of heating the sealing agent 51 to adhere it onto both the substrate 10 and the substrate 20, it can be adhered by both the substrate 10 and the substrate 20 being pressure bonded. Even in this case, as described previously, the amount of the adhesive is very small at no more than 10% relative to the total amount of the barrier rib 60, so that there is almost no influence by gas generated from the adhesive. Moreover, bonding can be carried out using bonding resins also allowing generation of gas without temperature increase at the time of curing, such as the below-described ultraviolet-ray curing resin, visible light curing resin, and delay curing resin.

From the above viewpoint, bonding resins to seal the two substrates at the time of manufacturing the related-art liquid crystal display apparatus, for example, an epoxy resin, an epoxy acrylate, an urethane acrylate, a silicone resin can also be used. These materials can be made to be an ultraviolet-ray curing resin or a thermosetting resin using a polymerization initiator added. The thermosetting resin can be made to be a delay curing resin, which delay curing resin can be bonded after a certain time by subjecting it to a thermal process at a location unrelated to the electronic element 30 (for example, a substrate at which the electronic element 30 is not formed), superimposing and then pressurizing both substrates. Therefore, the delay curing resin can be bonded without heating at the time of bonding to cause gas to be generated. Moreover, the ultraviolet-ray curing resin or visible light curing resin can also be bonded while generating almost no heat. Ultraviolet rays and visible light can also be irradiated by irradiating laser light. The above-mentioned cases, as described previously, can be used by sufficiently providing a spacing z between the sealing agent 50 and the barrier rib 60 such that heat generated at the time of adhering the sealing agent 50 is not conducted as much as possible.

When the ultraviolet-ray curing resin is used, there are advantages that it is not necessary to heat the previously-described ultraviolet-ray curing resin so that heat damage to the electronic element 30 such as an OLED to be sealed in is small relative to the heat damage in case that the thermosetting resin is used. Moreover, gas to be generated at the time of curing for the ultraviolet-ray curing resin is small and the problem that gas generated at the time of curing is sealed in between the substrates is also unlikely to arise. Moreover, curing for the ultraviolet-ray curing resin can be conducted in a short time relative to that for the thermosetting resin.

While the visible light curing resin has a longer curing time since irradiation energy is lower than that for the ultraviolet-ray curing resin, light transmittance is good, so there are advantages that it is safe for the human body, and, even more, that an irradiation apparatus for the visible light curing resin is inexpensive.

Since the delay curing resin is thermosetting, it needs to be heated, but, as it is not to be cured immediately after heating, it does not have to be heated after superimposing the two substrates as described previously, so that, after forming the barrier rib material 61 at a substrate at which the electronic element 30 is not formed, and heating, the two substrates are superimposed, allowing the delay curing resin to be bonded. Therefore, there is no heat damage to the electronic element 30 and, moreover, gas generated at the time of curing the delay curing resin and being sealed in between the substrates can also be suppressed.

According to the substrate sealing structure of the present Embodiment, the sealing agent 50 to seal the two substrates is realized using a low melting point glass material, causing the sealing agent to completely seal the substrates. In other words, the substrate sealing structure of the present Embodiment is characterized in, not having a way of thinking of a double sealing, but providing a structure to avoid the influence of heat generated at the time of completely sealing the substrates using glass. Therefore, outer air such as oxygen or moisture penetrating via a portion bonding to the substrate is substantially suppressed. Moreover, the sealing agent 50 is also glass, so that penetration of moisture is suppressed by the entire sealing agent 50. Even more, while temperature increases due to laser light irradiation at the time of bonding the sealing agent 50 to the first substrate 10 and the second substrate 20, the barrier rib 60 is formed between the sealing agent 50 and the electronic element 30, so that a part of the material of the electronic element 30 does not come into contact with the sealing agent 50 due to its flowing and, moreover, conductance of heat generated at the time of heating the sealing agent 50 can be shielded by the barrier rib 60. Therefore, degradation of the electronic element 30 due to heat generated at the time of bonding between the first and second substrates 10 and 20 and the sealing agent 50 is suppressed and, even more, penetration of moisture is almost completely suppressed, so that, even when the electronic element 30 being vulnerable to moisture and oxygen, such as the organic EL display element is provided, the reliability thereof substantially increases.

Embodiment 2: Display Apparatus

Next, a hybrid type display apparatus comprising an OLED 30a and an LCD 30b as the electronic elements 30 is described with reference to FIG. 2.

A display apparatus 200 according to Embodiment 2 of the present invention comprises: a TFT substrate 10 having a driving TFT 13 being formed for each pixel of a display screen and a first insulating layer 19 (a so-called a planarizing layer) planarizing a surface above the drive TFT 13; a reflecting electrode 41 for the LCD 30b, the reflecting electrode 41 being formed in a first region R of one pixel of the TFT substrate (a first substrate) 10 above the first insulating layer 19; an OLED 30a comprising a first electrode 31, an organic layer 33, a second electrode 34, and an encapsulating layer 35, the OLED 30a being formed in a second region T of the one pixel, the second region T being adjacent to the first region R on the first insulating layer 19 of the TFT substrate 10; an opposing substrate (second substrate) 20 comprising an opposing electrode (transparent electrode) 43 opposing the reflecting electrode 41, the opposing substrate 20 being arranged in a manner opposing the TFT substrate 10; a liquid crystal layer 42 being filled between the TFT substrate 10 and the opposing substrate 20; and a sealing agent 50 in which the TFT substrate 10 and the opposing substrate 20 are being adhered together, wherein the sealing agent 50 comprises a low melting point glass material and is adhered to each of the TFT substrate 10 and the opposing substrate 20; wherein a barrier rib 60 is arranged between the sealing agent 50 and the liquid crystal layer 42 and between the TFT substrate 10 and the opposing substrate 20; and wherein the sealing agent 50 and the barrier rib 60 are in separation.

Figure 2:
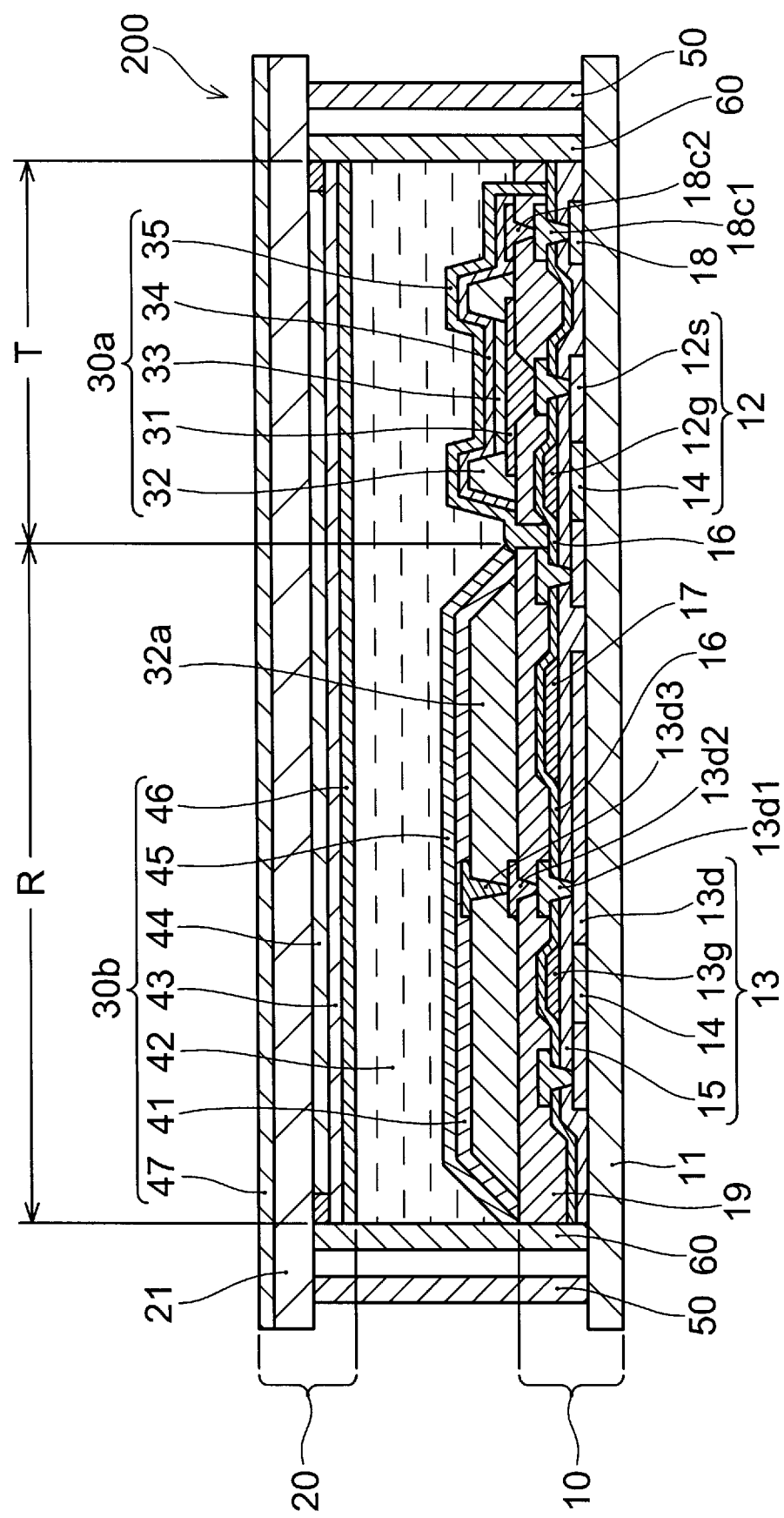
FIG. 2 shows a cross-sectional view of a display apparatus according to Embodiment 2.

In FIG. 2 while the barrier rib 60 and the sealing agent 50 are being formed in the surrounding of one LCD 30b and one OLED 30a, in actuality, a sub-pixel comprising a set of the LCD 30b and OLED 30a is formed for each of red (R), green (G), and blue (B), and, moreover, one pixel comprising a sub-pixel comprising the R, G, and B is formed in a plurality in a matrix. In the present embodiment, the entire elements being formed in the matrix are to be the electronic element 30, and the barrier rib 60 and sealing agent 50 are formed to surround the electronic element 30.

In the display apparatus 200 according to the present Embodiment, a reflecting type LCD 30b is formed in a first region R of one pixel, and a light emitting element such as the OLED 30a, for example, is formed in a second region T being adjacent to the first region R of one pixel. The reflecting type LCD 30b comprises the reflecting electrode 41, the liquid crystal layer 42, the transparent electrode 43 (opposing electrode), a color filter (CF) 44, a liquid crystal alignment layers 45, 46, respectively being formed on the surfaces of the reflecting electrode 41 and the transparent electrode 43, and a polarizer 47. The liquid crystal layer 42, transparent electrode 43, and polarizer 47 are formed at the entire display apparatus, extending toward the second region T. Moreover, the OLED 30a comprises the first electrode 31, a second insulating layer 32 called a so-called insulating bank, the second insulating layer 32 defining a light emitting region, the organic layer 33, the second electrode 34, and an encapsulating layer 35 encapsulating the surrounding thereof. While the second insulating layer 32 is formed also above the first insulating layer 19 of the first region R with the same material and in almost the same thickness, it is being separated from the second insulating layer 32 called the so-called insulating bank of the second region T, so that the second insulating layer in the first region R is called a third insulating layer 32a.

For the TFT substrate 10, on one surface of the insulating substrate 11 comprising a resin film such as polyimide, or a glass substrate, for example, is formed TFTs such as the driving TFT (a thin-film transistor, below merely called a TFT) 13 and a current supplying TFT 12, and a wiring such as a bus line (not shown) is formed, and the first insulating layer 19 called a so-called planarizing layer to planarize the surface. While the TFT is formed by a semiconductor layer 14 such as a polysilicon or amorphous semiconductor, a gate insulating layer 15, gate electrodes 13g, 12g, a passivation layer 16, explanations of details thereof will be omitted. In FIG. 2, an auxiliary capacitance electrode 17 being connected in parallel to the liquid crystal layer 42 of the LCD 30b is formed. This holds the voltage of the reflecting electrode 41 at the time of scanning in an active matrix display.

Moreover, in FIG. 2, a source 12s of the current supplying TFT 12 is connected to an anode electrode 31 of the OLED 30a. A cathode electrode 34 of the OLED 30a is connected to a cathode bus line 18 at via contacts 18c1 and 18c2. The first insulating layer 19 is aimed at eliminating unevenness between a portion on which the TFT is formed and a portion on which it is not formed to planarize the surface, it is preferably formed with an organic material such as polyimide. However, the first insulating layer 19 can be formed with an inorganic material. In a case that the first insulating layer 19 is formed with the inorganic material such as $SiO_2$ or $SiN_x$ using the CVD method, the thickness of a few μm is needed for planarizing, causing the layer forming time to increase. However, planarizing can be easily carried out using SOG (spin on glass). FIG. 2 shows the structure of elements conceptually, so that not all the respective elements are shown accurately.

A circuit for driving the LCD 30b and the OLED 30a is formed on the TFT substrate 10 in this way. While detailed explanations of the driving circuit are omitted, the reflecting electrode 41 is connected to a drain 13d of the driving TFT 13 via contacts 13d1 to 13d3, while a source 12s of the current supplying TFT 12 is connected to the first electrode 31 for the OLED 30a.

For the opposing substrate 20, the color filter 44, the opposing electrode 43, and the liquid crystal alignment layer 46 are formed on a substrate such as glass or a transparent (light transmitting) film, for example. For the LCD 30b, while there are various methods to turn the display screen into color, the color filter 44 is provided to form pixels of three primary colors of red (R), green (G), and blue (G) for each pixel. While color displaying can be made using the color filter 44 for the OLED 30a, the color filter 44 is not needed in a case of causing light of red (R), green (G), and blue (G) to be emitted directly by selecting a material for the organic layer 33. The liquid crystal alignment layer 46 to define alignment of the liquid crystal is formed on the surface opposing the liquid crystal layer 42 of the opposing substrate 20, and a rubbing process is carried out on the liquid crystal alignment layer 46.

The opposing substrate 20, and the TFT substrate 10 on which the OLED 30a is formed are adhered using the sealing agent 50 in the surrounding thereof with a certain spacing such that the reflecting electrode 41 and the opposing electrode 43 oppose each other. Adhering of the sealing agent 50 with the TFT substrate 10 and the opposing substrate 20 is carried out in a method similar to the method according to Embodiment 1 as described previously. A liquid crystal material to be a portion of the electronic element 30 being sealed in a gap portion of these both substrates 10 and 20 causes the liquid crystal layer 42 to be formed. Then, the polarizer 47 is provided on the surface opposite to the liquid crystal layer 42 of the opposing substrate 20. While the opposing electrode (transparent electrode) 43, the color filter (CF) 44, and the liquid crystal alignment layer 46 are not formed at a portion of the opposing substrate 20, the portion to be adhered onto the sealing agent 50, the insulating substrate 21 is exposed. For the TFT substrate 10 as well, the insulating substrate 11 is similarly exposed, causing the insulating substrates 11 and 21 to be adhered onto the sealing agent 50. However, in this way, it is not necessary for the insulating substrates 11 and 21 to be directly adhered onto the sealing agent 50. The sealing agent 50 can also be adhered to the surface of both the substrates 11 and 21 via an insulating film such as $SiO_2$.

The OLED 30a is formed in the second region T of one pixel and, as shown in FIG. 2, is formed the first electrode 31 being formed in the second region T on the surface of the first insulating layer 19, the second insulating layer 32 being formed in the surrounding of the first electrode 31 to surround the first electrode 31, the organic layer 33 formed on the first electrode (an anode. electrode) 31 being surrounded by the second insulating layer 32, the second electrode (a cathode electrode) 34 being formed on almost the entire surface of the OLED 30a thereon, and the encapsulating layer 35 encapsulating the surrounding thereof. The second insulating layer 32 can cover or does not have to cover the peripheral edge of the first electrode 31.

The first electrode 31 is formed as an anode electrode, for example. In the case of the present Embodiment, the display screen is to be viewed from the upper portion of FIG. 2, so that the first electrode 31 has a structure such that it is formed as a reflecting electrode and all of lights emitted are radiated upward. Therefore, a light reflecting material thereof is selected in accordance with the relationship of the work function with the organic layer 33 being in contact with this electrode 31. For example, the first electrode 31 is formed using a stacked film of ITO/APC/ITO.

The second electrode 32 also being referred to as an insulating bank is formed to define a light emitting region of the OLED 30a and prevent the anode electrode 31 and the cathode electrode 34 from being in contact and electrically connected with each other. The organic layer 33 is stacked on the first electrode 31 being surrounded by the second insulating layer 32. The second insulating layer 32 is formed with a resin such as polyimide or acrylic resin, for example. For the significance of aligning the heights of the first region R and the second region T, the second insulating layer 32 is also formed at the first region R in which the LCD 30b is formed. In other words, a liquid-like resin is applied onto the entire surface, and, thereafter, patterned to form the second insulating layer 32 in the surrounding of the first electrode 31 of the OLED 30a and the third insulating layer 32a of the first region R. At this time, the second insulating layer 32 toward the OLED 30a and the third insulating layer 32a toward the LCD 30b are divided such that the insulating layer 19 is exposed. This is convenient for the organic layer 33 and the second electrode (cathode electrode) 34 of the OLED 30a to be completely encapsulated by the encapsulating layer 35. In this case, as shown in FIG. 2, it is preferable also for the first insulating layer 19 to be etched so that the passivation layer 16, or a metal layer such as a pad or wiring is directly exposed. This is because the encapsulating layer 35 is formed with an inorganic layer, and bonding between inorganic layers has good airtightness and is easy to suppress penetration of moisture.

The organic layer 33 is stacked on the first electrode 31 being surrounded by the second insulating layer 32 and exposed from the second insulating layer 32. This organic layer 33 being shown as one layer in FIG. 2 is formed as a plurality of layers with various materials being stacked. Moreover, this organic layer 33 is vulnerable to moisture and cannot be patterned after forming it on the whole surface, so that it is formed by using a vapor deposition mask to selectively vapor deposit the evaporated or sublimed organic material on only a necessary portion, or using an application method such as inkjet.

Specifically, a positive-hole injecting layer comprising a material having a good ionization energy compatibility to improve positive-hole injectability can be provided as a layer being in contact with the first electrode (anode electrode) 31, for example. On this positive-hole injecting layer is formed a positive-hole transport layer using an amine-based material, for example, the positive-hole transport layer improving stable transport of positive-holes and allowing trapping of electrons into the light emitting layer (i.e., energy barrier). Moreover, thereabove is formed a light emitting layer in which an organic fluorescent material of red or green is doped to $Alq_3$ for red/green, for example, the light emitting layer to be selected in accordance with the light emitting wavelength. Moreover, as a blue color material, a DSA-based organic material is used. On the other hand, in a case of coloring with the color filter 44, the same material can be used to form the light emitting layer without using all dopants. Above the light emitting layer is formed, using $Alq_3$, an electron transport layer to further improve electron injectability and to stably transport electrons. A stacked organic layer 33 is formed by stacking these layers respectively having approximately few tens of nm in thickness. An electron injecting layer of LiF or Liq, for example, to improve electron injectability can also be provided between the organic layer 33 and the second electrode 34. In the present Embodiment, the organic layer 33 can comprise these respective organic and inorganic layers.

As described previously, in the stacked organic layer 33, with respect to the light emitting layer, an organic layer of a material according to each color of R, G, B can be deposited. In the example shown in FIG. 2, the light emitting layer is formed with the same material and a light emitting color is specified by the color filter 44. Moreover, emphasizing the light emitting performance, a material suitable for the light emitting layer is preferably used to separately deposit the positive-hole transport layer and the electron transport layer. However, taking the material cost aspect into account, the same material common to two or three colors of R, G, B can be used to deposit these layers.

After the entire stacked organic layer 33 comprising the electron injecting layer such as the LiF layer is formed, the second electrode 34 is formed on the surface thereof. Specifically, the second electrode (for example, the cathode electrode) 34 is formed on almost the entire surface of the OLED 30a. The second electrode 34 is formed with a light transmitting material, for example, a thin layer of Mg—Ag eutectic layer.

On the surface of the second electrode 34 is formed the encapsulating layer (TFE) 35 comprising an inorganic insulating layer of $Si_3N_4$, or $SiO_2$, for example, using one stacked layer, or at least two stacked layers. The encapsulating layer (TFE) 35 encapsulates the second electrode 34 and the organic layer 33. For example, the encapsulating layer (TFE) 35 is formed using one stacked layer having a thickness of approximately from 0.5 μm to 1.5 μm, or, preferably, approximately two stacked layers. The encapsulating layer 35 is preferably formed in a plurality of layers using different materials. Even when pin holes are created with the encapsulating layer 35 being formed in the plurality of layers, the pin holes seldom match completely in the plurality of layers, so that the encapsulating layer 35 is completely shielded from outer air. The encapsulating layer 35 is formed such that it completely encapsulates the organic layer 33 and the second electrode 34. Therefore, as shown in FIG. 2, the encapsulating layer 35 is formed such that it is closely in contact with the passivation layer 16 comprising an inorganic layer, or a wiring or a pad the passivation layer 16, the wire or the pad being further below than the first insulating layer 19 which is below the second insulating layer 32.

As described previously, in a case that the first insulating layer 19 is formed with an inorganic material, the encapsulating layer 35 is also an inorganic insulating layer, so that, even when it bonds on the surface of the first insulating layer 19, the close contact is sufficiently obtained. However, in a case that the first insulating layer 19 is an organic layer of polyimide, for example, the close contact with the encapsulating layer 35 decreases. Thus, as described previously, it is preferable that a groove (trench) be formed in the first insulating layer 19 and a portion of the encapsulating layer 35 be embedded thereinto.

The OLED 30a is formed in accordance with the above. As shown in FIG. 2, also above the OLED 30a is provided the liquid crystal layer 42 and the opposing electrode 43. However, in the OLED 30a region, there is no reflecting electrode (pixel electrode) 41 corresponding to the opposing electrode 43. Thus, the same situation as in a case of the voltage applied to the opposite surfaces of the liquid crystal layer 42 as described below being off occurs. In other words, while a normally-black state relative to external light is obtained, as the liquid crystal layer 42 is vertically-aligned, which is the same as having no liquid crystal layer 42, light emitted in the OLED 30a passes through the circular polarizer 47 without any change thereto. Then, the light passing through the circular polarizer 47 is visually recognized as it is, so that an image displayed by light emission in the OLED 30a is visually recognized from the front surface as it is.

Light emitted in the OLED 30a passing through the circular polarizer 47 attenuates in the circular polarizer 47 to approximately one half. However, preferably, this circular polarizer 47 is also formed in the second region T. This is because, since the first electrode 31 of the OLED 30a is formed with a light reflecting material, in a case that external light enters from the front, the display screen is very difficult to be viewed when light incident from the front exits to the exterior after being reflected by the first electrode 31 in the OLED 30a. However, with the presence of the circular polarizer 47, in a manner similar to the reflection at the reflecting electrode 41 of the LCD 30b as described below, when light is reflected by the first electrode 31, the direction of rotation of the circular polarized light is reversed, making it not possible for the reflected light to pass through the circular polarizer 47. As a result, the reflected light can be blocked. While the OLED 30a is not operated in a case of much external light, reflected light is produced regardless whether the OLED 30a is operated even during the operation of the LCD 30b, so that the visual recognition characteristics of the LCD 30b substantially degrades unless the circular polarizer 47 is in the second region T even during the operation of the LCD 30b.

The LCD 30b of the electronic element 30 is formed as a reflecting type LCD with the reflecting electrode 41 being formed on the entire surface of the first region R of approximately a half of one pixel, the liquid crystal layer 42, the opposing electrode 43, and the polarizer (circular polarizer) 47. As the liquid crystal layer 42 is difficult to be formed only in the first region R, it is formed on the entire surface also comprising the second region T, along with the opposing electrode 43, as described previously. In the example shown in FIG. 2, the color filter 44 is formed between the insulating substrate 21 and the opposing electrode 43 of the opposing substrate 20. As described previously, the liquid crystal alignment layer 46 is formed on the surface being in contact with the liquid crystal layer 42 of the opposing substrate 20, so that alignment of the liquid crystal molecules is regulated.

The reflecting electrode 41 being a so-called a pixel electrode is formed almost on the entire surface of the first region R. The reflecting electrode 41 is formed on the third insulating layer 32a toward the first region R being simultaneously formed with the same material as the second insulating layer 32 to be an insulating bank defining the light emitting region of the OLED 30a as described previously. The reflecting electrode 41 is connected, via the contact 13d1, and via contacts 13d2 and 13d3, to the drain 13d of the driving TFT 13 being formed at the TFT substrate 10, the via contact 13d2 being formed on the first insulating layer 19 and the contact 13d3 being formed on the third insulating layer 32a. The reflecting electrode 41 is formed with stacked layers of Al (aluminum) of from 0.05 μm to 0.2 μm and IZO (indium zinc oxide) of from 0.005 μm to 0.05 μm, for example.

At the time the second insulating layer 32 to partition the light emitting region of the OLED 30a is formed, the third insulating layer 32a is formed as an insulating layer of the same material as the second insulating layer 32 also in the first region R. However, as shown in FIG. 2, the second insulating layer 32 is divided at a portion bordering the first region R and the second region T, and the first insulating layer 19 is exposed at the bordering portion. In this way, the third insulating layer 32a also being formed in the first region R allows bringing the height of the underlayer of the liquid crystal layer 42 closer between the two regions R and T (more strictly, the thickness of the encapsulating layer 35 being different by approximately 1 μm).

The liquid crystal layer 42 comprising a liquid crystal composition, and various display modes such as an ECB (electronically controlled birefringence) mode, for example, can be used. For displaying without providing a polarizer, guest/host type can be used. The liquid crystal layer 42 shuts off/passes incident light for each pixel in accordance with on/off of the voltage between both electrodes being the reflecting electrode 41 and the opposing electrode 43 in cooperation with the polarizer 47. For the ECB mode, it is preferable that the liquid crystal layer 42 be formed in the thickness such that a ¼ phase difference occurs at the time of the voltage being on until light transmits the liquid crystal layer 42 and reaches the reflecting electrode 41. The liquid crystal alignment layer 45 is formed also on the surface of the TFT substrate 10 being in contact with the liquid crystal layer 42. The liquid crystal alignment layer 45 also regulates alignment of the liquid crystal molecules. Alignment of the liquid crystal alignment layer 46 being formed at the opposing substrate 20 and the liquid crystal alignment layer 45 being formed at the TFT substrate 10 is formed such they differ by a 90° angle, for example.

While alignment of the liquid crystal layer 42 is regulated by the liquid crystal alignment layers 45 and 46, in a case that the liquid crystal alignment layers 45 and 46 are formed such that the liquid crystal molecules are vertically aligned with the voltage not being applied onto the opposite surfaces of the liquid crystal layer 42, for example, as described below, reflected light of external light does not exit to the exterior with the voltage of greater than or equal to a threshold value not being applied between the reflecting electrode 41 and the opposing electrode 43, giving a black display state, or, in other words, a normally-black state. In this case, the OLED 30a is formed in the liquid crystal alignment layer 45 toward the TFT substrate 10, so that it is difficult to carry out a rubbing process or ultraviolet-ray irradiation. Thus, while a pre-tilt (inclination) angle is not formed, substantially effecting vertical alignment, a pre-tilt (inclination) angle of 80° to 89.9° is preferably formed on the liquid crystal alignment layer 46 toward the opposing substrate 20. The pre-tilt angle of the above-mentioned magnitude being formed makes it easier for the liquid crystal molecules around the center primarily in the cell thickness direction at the time the voltage is applied in between the two electrodes to transition to horizontal alignment.

In the example shown in FIG. 2, a circular polarizer is used for the polarizer 47. The circular polarizer is formed as a combination of a linear polarizer and a ¼ wavelength retardation plate. Moreover, a ½ wavelength retardation plate can also be used together to show the ¼ wavelength condition with respect to a wide range of wavelengths. The retardation plate comprises a uniaxially stretched optical film. Light passing through the circular polarizer has the phase of the linearly polarized light shifted by a ¼ wavelength and turns into a right polarized light, for example. As described previously, in a case that the voltage of greater than or equal to the threshold value is not applied to the reflecting electrode 41 and the opposing electrode 43 being provided on the opposite surfaces of the liquid crystal layer 42, and the liquid crystal layer 42 is vertically aligned, external light passes through the liquid crystal layer 42 as it is to be reflected by the reflecting electrode 41, causing reversal of light polarization from right circularly-polarized light to left circularly-polarized light. Therefore, external light returning to the circular polarizer 47 with the direction of rotation of incidence light and the direction of rotation of reflected light being reversed turns into linearly polarized light being orthogonal at an angle of 90° with respect to the transmitting axis of the linear polarizer, making it not possible to pass through the polarizer 47 and giving a black display state. On the other hand, the voltage of greater than or equal to the threshold value being applied to the electrodes on opposite surfaces of the liquid crystal layer 42 causes the liquid crystal molecules to be horizontally-aligned, and external light has the ¼ wavelength phase further shifted by the liquid crystal layer 42, causing the phase difference to be a ½ wavelength at the time the external light reaches the reflecting electrode 41, so that it is reflected as a linearly polarized light. After being reflected, the external light passes through a route in reverse of that at the time of incidence, so that it transmits the polarizer, giving a white display state. The polarizer 47 is not limited to the circular polarizer, so that it can also be a linear polarizer in accordance with the display mode.

In the example shown in FIG. 2, the opposing electrode 43, as described previously, is an electrode being common to all pixels, for applying or not applying a voltage for each of the pixels of the liquid crystal layer 42. Thus, the opposing electrode 43 is formed on the entire surface of the display screen, and also formed in the second region T in which the OLED 30*a* is formed as described previously. However, as the opposing electrode 43 is formed with ITO (indium tin oxide) or IZO (indium zinc oxide), for example, it transmits light, so that there is no problem as described previously.

The sealing agent 50 being the same as the sealing agent 50 according to Embodiment 1 as described previously is adhered, as shown in FIG. 3A, the sealing agent 50 is attached in the surrounding of the OLED 30*a* and the LCD 30*b* (the element forming region A) of the TFT substrate 10 or the opposing substrate 20 using a glass ribbon or a paste of glass frit of a low melting point glass, and the two substrates are superimposed and thereafter adhered. The adhering is carried out by the low melting point glass of the whole of the glass frit or at least at a portion of the glass ribbon that is bonded to the substrates 10 and 20 being turned into a softened state.

The barrier rib 60 being formed in separation with the sealing agent 50 between the sealing agent 50, and the LCD 30*b* and the OLED 30*a* is also the same as the barrier rib 60 according to Embodiment 1 as described previously, and it is formed with the same material as that for Embodiment 1, so the explanations thereof will be omitted. While the barrier rib 60 is in contact with the LCD 30*b* or the OLED 30*a* in the example shown in FIG. 2, the barrier rib 60 can be in contact with the electronic element 30 or it does not have to be in contact therewith. It is important that the sealing agent 50 and the barrier rib 60 are in separation.

Embodiment 3: Display Apparatus Manufacturing Method

Figure 4:
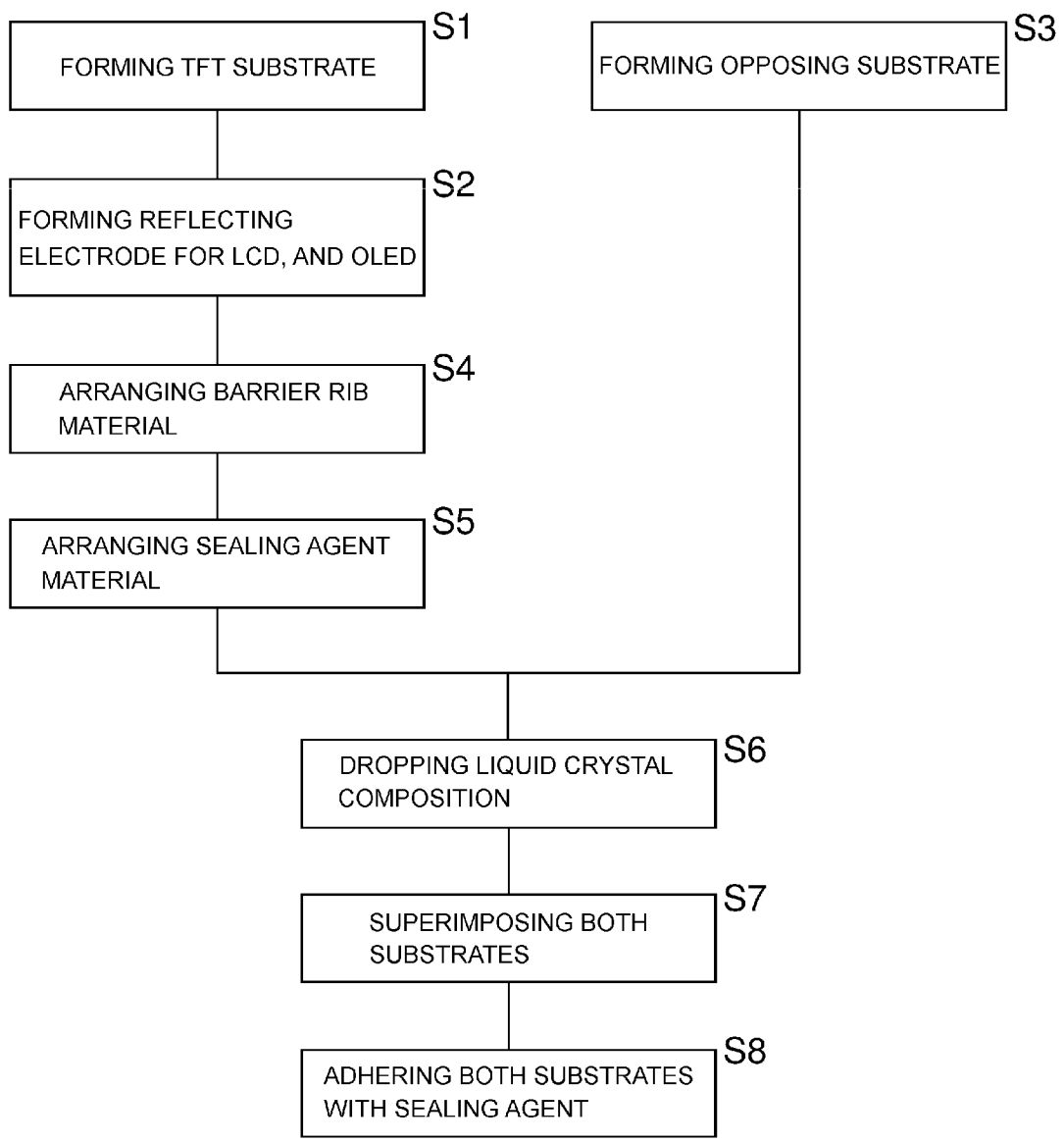
FIG. 4 shows a flowchart of a manufacturing method according to Embodiment 3.

Next, a display apparatus manufacturing method according to Embodiment 3 of the present invention is described with reference to FIGS. 2 and 4. The display apparatus manufacturing method according to the present Embodiment 3 comprises: forming a TFT substrate 10 on which at least a drive element is formed (S1); forming a reflecting electrode 41, and an OLED 30*a* above or on the surface of a TFT substrate 10, the reflecting electrode being for an LCD 30*b* (S2); forming an opposing substrate 20 having an opposing electrode 43 for the LCD 30*b* (S3); arranging a barrier rib material 61 (see FIG. 3A) at a peripheral edge portion of an element forming region A for the reflecting electrode 41 for the LCD 30*b* and the OLED 30*a* in either one of the TFT substrate 10 and the opposing substrate 20, (S4); arranging a sealing agent material 51 (see FIG. 3A) in separation with the barrier rib 60 at a portion opposite to the element forming region A for the LCD 30*b* and the OLED 30*a* of the barrier rib 60 in either one of the TFT substrate 10 and the opposing substrate 20 (S5); dropping a liquid crystal material onto the element forming region A for the LCD 30*b* and the OLED 30*a* being surrounded by the barrier rib 60 (S6); superimposing the TFT substrate 10 and the opposing substrate 20 (S7); and adhering the TFT substrate 10 and the opposing substrate 20 with the sealing agent material 51 (S8). Then, a material comprising a low melting point glass is used for the sealing agent material 51, and the sealing agent material 51 is adhered onto the TFT substrate 10 and the opposing substrate 20 by irradiation of laser light.

The element forming region A of substrate in which the electronic element 30 is not formed represents a region corresponding to the element forming region A of a substrate in which the electronic element 30 is formed when the two substrates are superimposed. Moreover, the individual steps as described above does not have to be carried out in the above-described order, so that, for example, step S3 can be carried out first, or the order of S4 and S5 can be reversed. Moreover, in FIG. 4, while steps S4 and S5 are carried out for the TFT substrate 10, they can be carried out for the opposing substrate 20.

First, the TFT substrate 10 is formed (S1). Specifically, a semiconductor layer 14 (a semiconductor layer in which a source 12*s* and a drain 13*d* are formed) and a bus line (not shown) are formed on an insulating substrate 11, and a gate insulating layer 15 comprising $SiO_2$ is formed thereon. Then, impurities are doped into a given region of the semiconductor layer 14, causing each of the drain 13*d* (see FIG. 2) of a driving TFT 13 and the source 12*s* (see FIG. 2) of a current supplying TFT 12 to be formed. Then, a gate electrode 13*g* of the driving TFT 13, a gate electrode 12*g* of the current supplying TFT 12, and an auxiliary capacitance electrode 14 are formed on the gate insulating layer 15. A passivation layer 16 comprising $SiN_x$ is formed on the surface thereof. Then, a contact such as a drain contact 13*d*1 of the driving TFT 13 is formed, and a first insulating layer 19 to planarize the surface thereof is formed using polyimide, for example. The first insulating layer 19, as described previously, can be formed with an inorganic layer of SOG.

Next, the reflecting electrode 41 and the OLED 30*a* are formed above or on the surface of the TFT substrate 10, the reflecting electrode being for the LCD 30*b* (S2). Specifically, a first electrode (anode electrode) 31 for the OLED 30*a* is formed with a stacked layer of ITO/APC (Ag—Pd—Cu alloy)/ITO with respect to an organic layer 33. A contact 13*d*2 to connect with the drain 13*d* of the driving TFT 13 is also formed on the surface of the first insulating layer 19. The contact 13*d*2 for the LCD 30*b* is formed by forming a contact hole and embedding a conductive layer thereinto.

Then, a second insulating layer 32 is formed using a polyimide or acrylic resin. The second insulating layer 32 being to divide each pixel of the OLED 30*a* is formed such that it surrounds the first electrode 31 and comprises a convex part. A resin layer is formed on the entire surface of the TFT substrate for the second insulating layer 32 in a liquid-like state, and, thereafter the second insulating layer 32 is formed by patterning in a desired shape at a desired location. In the present Embodiment, regarding the second insulating layer 32, applying is carried out on the entire surface of the TFT substrate 10 in a thickness aligned to the height of the convex part being formed in the surrounding of the first electrode 31 and a bordering portion with a third insulating layer 32a and the first electrode 31 are exposed by patterning. In this way, the second insulating layer 32 and the third insulating layer 32a are separated, and the second insulating layer 32 is formed such that the insulating layer 19 is exposed between the second insulating layer 32 and the third insulating layer 32a. As a result, by an encapsulating layer 35 formed thereabove, the organic layer 33 and the second electrode 34 thereon of the OLED 30a can be completely capsulated.

At the time of patterning the second insulating layer 32, a contact hole connecting to the contact 13d1 of a first region R is formed, causing a third contact 13d3 to be formed. As a result, the third contact 13d3 connected to the drain 13d of the driving TFT 13 is exposed on a portion of the third insulating layer 32a. Moreover, a trench is formed also in a portion of the first insulating layer 19 which is an exposed portion by being divided into the second insulating layer 32 and the third insulating layer 32a, causing a metal layer of a pad or wiring, or the passivation layer 16 being an underlayer thereof to be exposed. This is to seek embedding of the encapsulating layer 35 to bond between inorganic layers in the post process. In a case that the first insulating layer 19 is formed with an inorganic layer, the above-mentioned trench does not need to be formed.

Thereafter, the organic layer 33 is formed. As the organic layer 33 is vulnerable to moisture and oxygen, it cannot be patterned, so that only a necessary region thereof is vapor deposited using a vapor deposition mask. Alternatively, it can be formed by printing such as inkjet. In a case of forming by vapor deposition, the vapor deposition mask is arranged in alignment with the top of the convex part of the second insulating layer 32, and the organic material sublimed or vaporized by a crucible is deposited on the first electrode 31 surrounded by the second insulating layer 32. The organic material is deposited using various materials as described previously.

Next, the second electrode 34 to be a cathode electrode is formed on the almost entire surface of the OLED 30a comprising the convex part of the second insulating layer 32 and the organic layer 33. The second electrode 34 for which an Mg—Ag alloy, for example, is used is formed by vapor deposition using a vapor deposition mask.

Thereafter, the encapsulating layer 35 is formed. This encapsulating layer 35 being a layer to protect the organic layer 33 from moisture and oxygen is formed with an inorganic layer of $SiN_x$ or $SiO_2$, for example. Even more, pin holes can be formed at the time of layer forming, so that it is preferably formed with multiple layers, the multiple layers comprising at least two layers. The encapsulating layer 35 is formed using CVD or ALD (atomic layer deposition). Preferably, the encapsulating layer 35 is deposited in multiple layers using different materials. While the encapsulating layer 35 can be formed above the OLED 30a, it can also be formed such that it extends toward the LCD 30b being the first region R. However, it is necessary for the encapsulating layer 35 to not extend across the contact 13d3. Because forming the encapsulating layer 35 above the contact 13d3 necessitates forming a through hole in the encapsulating layer 35 for the contact. And, in that case, moisture travels through the inner surface of the through hole to penetrate the second electrode 34 or the organic layer 33.

At the time of forming the encapsulating layer 35, the material thereof is embedded also into the trench formed in the first insulating layer 19, and the encapsulating layer 35 is bonded to an inorganic layer such as the passivation layer 16, the inorganic layer being an underlayer of the first insulating layer 19. The encapsulating layer 35 can be formed on the whole surface, and, then, patterned by etching. This is because the encapsulating layer 35 being in closely contact with the passivation layer 16 prevents penetration of moisture. However, it can also be deposited at only a desired location using a mask. The latter is preferable from the viewpoint of preventing penetration of moisture.

Thereafter, a reflecting electrode (pixel electrode) 41 for the LCD 30b is formed on the surface of the third insulating layer 32a of the first region R. As a result, the reflecting electrode 41 is also electrically connected to the contact 13d3. The reflecting electrode 41 is formed with Al and IZO, for example. This reflecting electrode 41 is also formed in almost a half of one pixel, except for the entire surface of the OLED 30a. Even in this case, it can also be formed by patterning of a reflecting layer formed on the whole surface thereof by vapor deposition. This is because the organic layer 33 is completely encapsulated by the encapsulating layer 35. However, it can also be formed only in a desired region by covering with a mask. In this way, the electronic element 30 in the second region T and the first region R on the TFT substrate 10 is formed.

In the meantime, the opposing substrate 20 comprising the opposing electrode 43 for the LCD 30b is formed (S3). The opposing substrate 20 is formed by stacking the light transmitting opposing electrode 43, and, as needed, a color filter 44 or a liquid crystal alignment layer 46 on an insulating substrate 21 such as a glass plate or a resin film.

Thereafter, a barrier rib material 61 (see FIG. 3A) is arranged at a peripheral edge portion of a region (the element forming region A) forming the reflecting electrode 41 and the OLED 30a in either one of the TFT substrate 10 and the opposing substrate 20, the reflecting electrode 41 being for the LCD 30b (S4). The barrier rib material 61 can be arranged in the opposing substrate 20, not the TFT substrate 10. In this case, when the TFT substrate 10 and the opposing substrate 20 are superimposed, the barrier rib material 61 needs to be formed such that the reflecting electrode 41 for the LCD 30b, and the OLED 30a are housed in a region surrounded by the barrier rib material 61. In other words, the barrier rib material 61 is arranged at a peripheral edge of a region of the opposing substrate 20 being opposed to the element forming region A of the TFT substrate 10. While an inorganic material is preferable for the barrier rib material 61 as described previously, a resin material such as an epoxy resin can also be used. The barrier rib material 61 can be arranged by turning it into paste form, and applying the paste form, or it can be attached by making a ribbon form. The height of the barrier rib material 61 is selected in alignment with the spacing of the two substrates to be adhered together. Normally, the height of the barrier rib material 61 is approximately from 5 μm to 10 μm.

In a case that the barrier rib material 61 is arranged with a solid matter such as a glass ribbon, the glass ribbon can be fixed using an adhesive. At the barrier rib material 61 does not be adhered after superimposing the two substrates 10 and 20, it is preferable to be adhered on the whole surface being in contact with the substrates. However, after attaching or after forming using the previously-described thermosetting resin, gas comprised in the organic material can be expelled by heating and solidifying before superimposing the substrates 10 and 20. As shown in FIG. 2, the barrier rib material 61 can be formed such that it comes into contact with the LCD 30b or the OLED 30a, or it can be formed in separation with the electronic elements 30. While it is preferable that an ITO layer, a CF layer, and an insulating layer being formed in a peripheral edge of the TFT substrate 10 and the opposing substrate 20 be removed, they do not have to be removed.

Moreover, when the barrier rib 60 is adhered to both the TFT substrate 10 and the opposing substrate 20, in a case that the barrier rib material 61 comprises powder of an inorganic material, an adhesive, especially an adhesive that can be cured by ultraviolet rays, is preferably applied onto the upper surface thereof. Moreover, using the previously-described ultraviolet-ray curing resin, visible light curing resin, and delay curing resin causes almost no gas to be generated even at the time of adhering, making it possible to surely fix the substrates 10 and 20. In this case, the barrier rib material 61 is adhered onto the substrates in advance using ultraviolet rays and, thereafter, the sealing agent material 51 can be adhered onto the substrates 10 and 20. Moreover, the barrier rib material 61 and the sealing agent material 51 can also be adhered onto the substrates 10 and 20 simultaneously Then, the sealing agent material 51 (see FIG. 3A) is arranged in separation with the barrier rib 60 at a portion opposite to a forming region (the element forming region A) of the LCD 30b and OLED 30a of the barrier rib 60 in one of the TFT substrate 10 or the opposing substrate 20 (S5). The sealing agent material 51 can be arranged in either one of the TFT substrate 10 and the opposing substrate 20. There is also no limitation on a substrate in which the barrier rib material 61 is to be formed. The barrier rib material 61 and the sealing agent material 51 can be formed in different substrates so long as they are formed such that, when superimposed, the barrier rib material 61 and the sealing agent material 51 are in separation with each other and have the same height. The sealing agent material 51 can be turned into paste form as described previously, or one end portion or both end portions of a glass ribbon can be arranged by fixing with an adhesive. Even in a case of the end portion or end portions being fixed by pasting with the adhesive, it is preferably arranged such that the end portion or end portions is adhered at the exterior of an adhering portion of the sealing agent 50 as previously shown in FIGS. 3B and 3C.

The sealing agent 50 is adhered by softening a low melting glass being the sealing agent material 51 to the TFT substrate 10 and the opposing substrate 20. It is preferably adhered directly to the insulating substrates 11 and 21 exposed as shown in FIG. 2. This is because enough adherence is difficult to be obtained in a case that a different layer such as ITO is present therebetween. The above sealing agent material 51 is also formed with approximately the same height as that of the barrier rib material 61.

Thereafter, a liquid crystal material (a liquid crystal composition) is dropped onto the forming region of the LCD 30b and the OLED 30a being surrounded by the barrier rib 60 (S6). The dropping of the liquid crystal composition is preferably carried out under vacuum atmosphere. This is because it is easier to discharge air bubbles entrained in the liquid crystal material at the time of dropping. The liquid crystal material being dropped protrudes due to surface tension, so that it does not fall even when the substrate is turned upside down.

Then, the opposing substrate 20 and the TFT substrate 10 in which the OLED 30a or the like is formed are superimposed such that the respective electrodes oppose each other (S7). After they are superimposed, it is preferable that they be placed in atmospheric or higher pressure since uniform pressure can be exerted onto the two substrates. In this case, they are preferably placed in nitrogen (100% $N_2$) atmosphere or in dry air. In particular, with respect to the dry air, dry air having a dew point of not more than −50 degree Celsius is especially preferable. At this time, sealing using the sealing agent 50 has not been carried out yet, so that dry nitrogen can penetrate the interior from the sealing agent 50.

Thereafter, the sealing agent material 51 is turned into a softened state using $CO_2$ laser, for example, causing the TFT substrate 10 and the opposing substrate 20 to be adhered (S8). Carrying out sealing using the sealing agent 50 under dry atmosphere makes it possible to fill at least the space between the sealing agent 50 and the barrier rib 60 with dry nitrogen. After the adhering, a polarizer 47 is pasted onto a surface opposite to the opposing electrode 43 of the insulating substrate 21. In a case that the polarizer 47 is a circular polarizer, a ¼ wavelength retardation plate toward the insulating substrate 21 and a linear polarizer thereon are superimposed. This results in making it possible to further prevent penetration of external moisture. Then, a hybrid type display apparatus 200 is obtained in which the reflecting type LCD 30b is formed in the first region R in which the reflecting electrode 41 is formed and the OLED 30a is formed in the second region T.

(Conclusion)

(1) A substrate sealing structure according to Embodiment 1 comprises: a first substrate and a second substrate, the first substrate and the second substrate being arranged in an opposing manner; an electronic element being formed between the first substrate and the second substrate; and a sealing agent to seal the first substrate and the second substrate at the outer periphery of the electronic element, wherein the sealing agent comprises a low melting point glass material and is adhered onto each of the first substrate and the second substrate; wherein a barrier rib being formed to surround the outer periphery of the electronic element is arranged between the sealing agent and the electronic element and between the first substrate and the second substrate; and wherein the sealing agent and the barrier rib are in separation.

According to the present Embodiment, a barrier rib is formed between a sealing agent and an electronic element while a sealing agent is adhered using a low melting point glass and, even more, the sealing agent and the barrier rib are in separation, making it more difficult for heat generated at the time of adhering using the sealing agent more difficult to be transferred toward the electronic element. As a result, a deleterious influence on the electronic element is suppressed while obtaining a reliable sealing.

(2) A distance of the separation being no less than 0.5 mm causes heat conductance to be extremely reduced, because the heat being conducted through the air gap, so that there is a large effect of suppressing heat conductance.

(3) The sealing agent is preferably a cured glass of a glass frit being softened, since complete sealing can be carried out while manufacturing is easy.

(4) The sealing agent can be formed by a glass ribbon being adhered to the first substrate and the second substrate. The glass ribbon is made without a binder, so that unnecessary gas can surely be eliminated without sealing in the gas.

(5) By the barrier rib being adhered onto the first substrate and the second substrate, a spacing between the both substrates is stabilized, so that it is preferable for maintaining the performance of an electronic device.

(6) The barrier rib being such that no less than 90% of a volume thereof is an inorganic material is preferable. Because it can suppress generation of gas from the barrier rib itself.

(7) The barrier rib being a solidified fine powders of at least one type of glass, ceramics, semiconductors, metals, and metal oxides is preferable, because of an easily-obtainable material and being simply embodied.

(8) The barrier rib comprising the glass ribbon makes it possible to obtain a barrier rib comprising almost no organic material.

(9) The barrier rib being a bonding resin of one type selected from a group of an ultraviolet-ray curing resin, a visible light curing resin, and a delay curing resin is preferable in that it allows suppressing generation of gas by a barrier rib material while being able to manufacture with the same method as a case of manufacturing a related-art liquid crystal display apparatus.

(10) A display apparatus according to Embodiment 2 comprises: a TFT substrate comprising a drive element being formed for each pixel of a display screen and a first insulating layer planarizing a surface above the drive element; a reflecting electrode for a liquid crystal display element, the reflecting electrode being formed above the first insulating layer in a first region of one pixel of the TFT substrate above the first insulating layer; an organic EL display element comprising a first electrode, an organic layer, a second electrode, and an encapsulating layer, the organic EL display element being formed in a second region of the one pixel, the second region being adjacent to the first region on the first insulating layer of the TFT substrate; an opposing substrate comprising an opposing electrode opposing the reflecting electrode, the opposing substrate being arranged in a manner opposing the TFT substrate; a liquid crystal layer being filled between the TFT substrate and the opposing substrate; and a sealing agent adhering together the TFT substrate and the opposing substrate, wherein the sealing agent comprises a low melting point glass material and is adhered onto each of the TFT substrate and the opposing substrate; wherein a barrier rib is arranged between the sealing agent and the liquid crystal layer and between the TFT substrate and the opposing substrate; and wherein the sealing agent and the barrier rib are in separation.

According to the present Embodiment, in a hybrid type display apparatus comprising an LCD and an OLED, the OLED being vulnerable to moisture and oxygen can be protected effectively. As a result, even under severe environmental conditions such as for automobile use, more reliable display apparatus can be obtained.

(11) A display apparatus manufacturing method according to Embodiment 3 comprises: forming an organic EL display element and a reflecting electrode for a liquid crystal display element above or on a surface of the TFT substrate;

forming an opposing substrate comprising an opposing electrode for the liquid crystal display element;

arranging a barrier rib material on either one of the TFT substrate and the opposing substrate, wherein the barrier rib material is arranged at a peripheral edge portion of an element forming region for the organic EL display element and the reflecting electrode for the liquid crystal display element;

arranging a sealing agent material on either one of the TFT substrate and the opposing substrate, wherein the sealing agent material is arranged in separation with the barrier rib material at an opposite portion to the element forming region with respect to the barrier rib material; dropping a liquid crystal composition onto the element forming region surrounded by the barrier rib material; superimposing the TFT substrate and the opposing substrate; and adhering the TFT substrate and the opposing substrate using the sealing agent material, wherein a material comprising a low melting point glass is used for the sealing agent material, and the sealing agent material is adhered onto the TFT substrate and the opposing substrate by irradiation of laser light.

According to the present Embodiment, the barrier rib material and the sealing agent material are arranged at one of the substrates, the substrates are superimposed, and then the sealing material agent is turned into a softened state to carry out sealing, so it makes easy manufacturing possible. Even more, an organic material of the barrier rib can be discharged before sealing, making it possible to eliminate the possibility of sealing in gas between the substrates even when the organic material such as a resin is used for the barrier rib.

(12) A glass frit being used for the sealing agent, and the glass frit being applied by printing or dispensing, and, thereafter by laser light, the glass frit is softened and then cured to adhere the TFT substrate and the opposing substrate make it possible to easily arrange a glass material.

(13) A glass ribbon being used for the sealing agent, and attached onto a given portion of either one of the TFT substrate and the opposing substrate, and, thereafter, the TFT substrate and the opposing substrate being superimposed and adhered by laser light make it possible to reduce the possibility of sealing in gas based on a binder or the like.

(14) It is preferable that, wherein, the entire periphery of the sealing agent to be adhered is made into a plurality of divided parts; the glass ribbon is formed in a plurality sections, each of the plurality sections being correspond to each of the divided parts; and one end or both ends of the plurality sections are adhered on one of the TFT substrate or the opposing substrate, wherein the one end or both ends are adhered at an opposite portion to the barrier rib with respect to the sealing agent to be attached. As a result, the adhesive portion is not heated much and, even if the adhesive portion is heated to cause gas to be generated from the adhesive, the gas can be completely suppressed without entering the region of an electronic element between the substrates.

(15) One type of bonding resin selected from a group of an ultraviolet-ray curing resin, a visible light curing resin, and a delay curing resin is used for the barrier rib material, and after superimposing the TFT substrate and the opposing substrate, the barrier rib material can be bonded to each of the TFT substrate and the opposing substrate.

(16) A paste of fine powders of at least one type of glass, ceramics, semiconductors, metals and metal oxides being applied and then cured to form a barrier rib, and, thereafter, the TFT substrate and the opposing substrate being superimposed and bonded together cause gas generated from a binder to be discharged in advance, so that there is no possibility of the gas sealing in between the substrates.

(17) A ribbon of an inorganic material being arranged at a given portion to form a barrier rib makes it possible to almost prevent generation of gas from the barrier rib.

(18) The barrier rib material and the sealing agent material being continuously arranged at either one of the TFT substrate and the opposing substrate, and thereafter, the TFT substrate and the opposing substrate being superimposed and then a sealing agent being adhered onto the TFT substrate and the opposing substrate are efficient in that it is made possible to continuously form the barrier rib material and the sealing agent material in a case that the sealing agent and the barrier rib material are applied as a paste.

(19) Dropping the liquid crystal composition and superimposing the TFT substrate and the opposing substrate can be carried out under vacuum atmosphere, and, thereafter, the TFT substrate and the opposing substrate can be adhered using the sealing agent under nitrogen atmosphere. In this way, injecting of the liquid crystal material is carried out under vacuum atmosphere, making it easy to discharge air bubbles, and, thereafter, sealing is carried out under nitrogen atmosphere, so that the space between the sealing agent and a barrier rib is also not vacuum, and nitrogen is present therebetween, making it easy to prevent penetration of external moisture.

EXPLANATION OF REFERENCE NUMERALS

10 FIRST SUBSTRATE (TFT SUBSTRATE)
13 DRIVING TFT
19 FIRST INSULATING LAYER
20 SECOND SUBSTRATE (OPPOSING SUBSTRATE)
30 ELECTRONIC ELEMENT
30a ORGANIC EL LIGHT EMITTING ELEMENT (OLED)
30b LIQUID CRYSTAL DISPLAY ELEMENT (LCD)
31 FIRST ELECTRODE (ANODE ELECTRODE)
32 SECOND INSULATING LAYER
32a THIRD INSULATING LAYER
33 ORGANIC LAYER
34 SECOND ELECTRODE (CATHODE ELECTRODE)
35 ENCAPSULATING LAYER (TFE)
41 REFLECTING ELECTRODE (PIXEL ELECTRODE)
42 LIQUID CRYSTAL LAYER
43 OPPOSING ELECTRODE
47 POLARIZER
50 SEALING AGENT
51 SEALING AGENT MATERIAL
60 BARRIER RIB
61 BARRIER RIB MATERIAL
100 SEALING STRUCTURE
200 DISPLAY APPARATUS
A ELEMENT FORMING REGION
B ADHERING PORTION
R FIRST REGION
T SECOND REGION

The invention claimed is:

1. A substrate sealing structure comprising:
a first substrate and a second substrate, the first substrate and the second substrate being arranged in an opposing manner;
an electronic element being formed between the first substrate and the second substrate;
a barrier rib being formed between the first substrate and the second substrate to surround the electronic element at a peripheral portion of an element forming region for the electronic element; and
a sealing agent to seal a region between the first substrate and the second substrate to surround the barrier rib at an opposite portion to the element forming region with respect to the barrier rib,
wherein the sealing agent consists of a glass ribbon comprising a low melting point glass material not including any organic material, wherein the glass ribbon is arranged at an entire periphery of a sealing portion surrounding the barrier rib and is adhered onto each of the first substrate and the second substrate;
wherein the entire periphery of the sealing portion is divided into a plurality of divided parts, the glass ribbon is arranged in a plurality of sections, each of the plurality of sections corresponding to each of the plurality of divided parts, and only one end or both ends, which one end or both ends are ends in a parallel direction with respect to a surface of the first substrate, of each of the plurality of sections are attached with an adhesive agent on one of the first substrate and the second substrate so as to adhere adjacent sections of the plurality of sections to each other; and
wherein the barrier rib comprises a solid matter and at least one end part of the solid matter is adhered to the first substrate or the second substrate with an adhesive agent, the one end part being an end part in an orthogonal direction with respect to the surface of the first substrate.

2. The substrate sealing structure according to claim 1, wherein the one end or the both ends of each of the plurality of sections are adhered to the first substrate or the second substrate at a protruded position which is an opposite outer position to the element forming region with respect to the sealing portion.

3. The substrate sealing structure according to claim 1, wherein only the one end part of the solid matter making up the barrier rib is adhered onto the first substrate or the second substrate, and another end part of the solid matter is not adhered onto the first substrate or the second substrate.

4. A display apparatus manufacturing method, the display apparatus manufacturing method comprising:
forming an electronic element on a first substrate;
preparing a second substrate which is to be adhered to the first substrate in a manner opposing the first substrate;
arranging a barrier rib material at a peripheral portion of an element forming region for the electronic element of the first substrate or at a portion of the second substrate, the portion of the second substrate being a portion to surround the element forming region when the second substrate is adhered to the first substrate;
forming a barrier rib comprising a solid matter by fixing the barrier rib material on the first substrate or the second substrate;
after forming the barrier rib, arranging a sealing agent material comprising a low melting point glass material on either one of the first substrate and the second substrate, at an outer periphery of an opposite portion to the electronic element with respect to the barrier rib, and then superimposing the first substrate and the second substrate; and
adhering the first substrate and the second substrate using the sealing agent material,
wherein the sealing agent material is formed by one or a plurality of glass ribbons, the one or the plurality of glass ribbons are made of only glass material not including any organic material, and only the glass ribbon is arranged along an entire periphery of a sealing portion surrounding the barrier rib without a glass flit being present even partially.

5. The display apparatus manufacturing method according to claim 4,
wherein, in the process of arranging the plurality of glass ribbons, the entire periphery of the sealing portion is divided into a plurality of divided parts; the plurality of glass ribbons are arranged in a plurality of sections, each of the plurality of sections corresponding to each of the plurality of divided parts; and only one end or both ends, which one end or both ends are ends in a parallel direction with respect to a surface of the first substrate, of each of the plurality of sections are adhered on one of the first substrate and the second substrate so as to adhere adjacent sections of the plurality of sections to each other.

6. The display apparatus manufacturing method according to claim 5, wherein the one end or the both ends of each of the plurality of sections are adhered at a protruded position which is an opposite outer position to the element forming region with respect to the sealing portion.

* * * * *